United States Patent
Eberhard et al.

(10) Patent No.: US 11,710,866 B2
(45) Date of Patent: Jul. 25, 2023

(54) SYSTEM AND METHOD FOR MANAGEMENT OF HETEROGENEOUS BATTERY MODULES

(71) Applicant: American Battery Solutions, Inc., Lake Orion, MI (US)

(72) Inventors: Martin Eberhard, Woodside, CA (US); Olaf Brandt, Palo Alto, CA (US); Jessica Riley, Half Moon Bay, CA (US); Darren J. Croke, Durango, CO (US); Rob Sweney, San Francisco, CA (US); Brennan Campbell, Monte Sereno, CA (US); Ania Mitros, Mountain View, CA (US)

(73) Assignee: AMERICAN BATTERY SOLUTIONS, INC., Dover, DE (US)

( * ) Notice: Subject to any disclaimer, the term of this patent is extended or adjusted under 35 U.S.C. 154(b) by 318 days.

(21) Appl. No.: 16/897,062

(22) Filed: Jun. 9, 2020

(65) Prior Publication Data

US 2021/0384561 A1 Dec. 9, 2021

(51) Int. Cl.
*H01M 10/48* (2006.01)
*G01R 31/388* (2019.01)
*H01M 10/42* (2006.01)

(52) U.S. Cl.
CPC ........ *H01M 10/482* (2013.01); *G01R 31/388* (2019.01); *H01M 10/425* (2013.01); *H01M 2010/4271* (2013.01)

(58) Field of Classification Search
CPC ............ H01M 10/482; H01M 10/425; H01M 2010/4271; G01R 31/388; Y02E 60/10; Y02T 10/70; B60L 50/64; B60L 50/66; B60L 58/13; B60L 58/16; B60L 58/21; B60L 58/22; B60L 58/20
See application file for complete search history.

(56) References Cited

U.S. PATENT DOCUMENTS

| 2012/0161708 | A1  | 6/2012  | Miura et al. |
| 2016/0226263 | A1* | 8/2016  | Seo .................. H02J 7/0048 |
| 2019/0176803 | A1  | 6/2019  | Tabatowski-Bush et al. |
| 2020/0039358 | A1  | 2/2020  | Duan |

FOREIGN PATENT DOCUMENTS

| CN | 105150874 A | * 12/2015 |
| EP | 2043222 A2  | 4/2009 |

OTHER PUBLICATIONS

Jaber Abu Qahouq et al., Control Scheme and Power Electronics Architecture for a Wirelessly Distributed and Enabled Battery Energy Storage System, Energies 2018, 11, 1887, 2018 (Year: 2018).*

* cited by examiner

*Primary Examiner* — Daniel R Miller
(74) *Attorney, Agent, or Firm* — Finnegan, Henderson, Farabow, Garrett & Dunner, LLP

(57) ABSTRACT

A battery management system and method that allows a battery bank to be composed of battery modules that can be heterogeneous with respect to each other. A battery bank composed of modules that support the battery management system allows for any subset of modules to be easily replaced with modules of different electrochemical characteristics. Each of the modules may also have a controller that manages cells of the module. The bank level controller and module level controller may operate to virtualize the hardware under their management to reduce or eliminate the heterogeneous features of the underlying cells and modules.

27 Claims, 14 Drawing Sheets

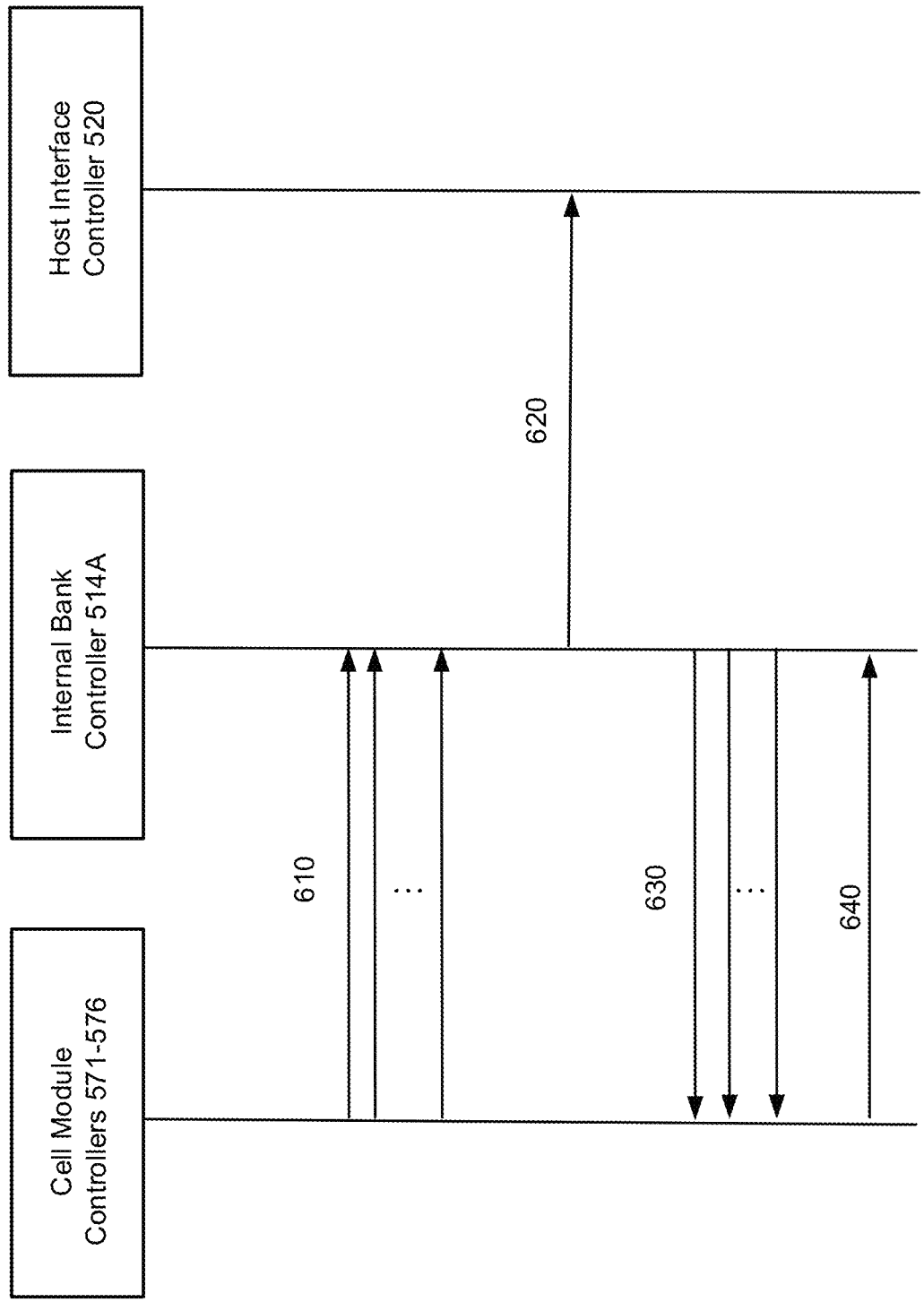

SYSTEM AND METHOD FOR MANAGEMENT OF HETEROGENEOUS BATTERY MODULES

BACKGROUND

1. Field of the Disclosure

Embodiments relate to a battery management system for handling modular batteries of different specifications, ages, and/or capabilities.

2. Description of the Related Art

Energy storage systems may rely upon batteries for storage of electrical power. For example, in certain conventional electric vehicle (EV) designs (e.g., fully electric vehicles, hybrid electric vehicles, etc.), a battery housing mounted into an electric vehicle houses a plurality of battery cells (e.g., which may be individually mounted into the battery housing, or alternatively may be grouped within respective battery modules that each contain a set of battery cells, with the respective battery modules being mounted into the battery housing). Composing a battery bank from a set of battery cells connected in series is common practice in battery system design. To achieve the desired power and energy capacity, each cell in the stack of 100 cells is typically put in parallel with similar cells to form a parallel group.

When such a battery bank is composed of rechargeable battery cells, each cell must be kept within its safe operating limits. In particular, with Li-ion batteries overcharging any individual cell may result in a hazardous thermal event or explosion. Conversely over-draining any cell can damage the cell making it more susceptible to thermal events during subsequent use. Beyond the safe voltage ranges for battery cells, the cells also have maximum current limits, and thermal operating ranges that must be maintained in order to ensure the safe operation of the bank for the lifetime target of the bank. As a result conventional battery banks must be composed of homogenous cells so that the electrochemical behavior and limits of the cells are common and predictable across the battery bank.

SUMMARY

An embodiment of the disclosure is directed to operating at least one electrical controller that manages a battery bank arranged with a heterogeneous battery module configuration. The controller or system of controllers monitors a set of performance attributes associated with a plurality of battery modules of the battery bank, the plurality of battery modules being connected in series with each other. The controller detects, based on the monitoring, a first set of performance levels for the set of performance attributes in association with a first subset of the plurality of battery modules. The controller detects, based on the monitoring, a second set of performance levels for the set of performance attributes in association with a second subset of the plurality of battery modules. The controllers manage one or more bank-wide operational parameters based at least in part upon a differential between the first and second set of performance levels.

The controllers calculate a capacity of the battery bank based on the first and second set of performance levels and send the calculated battery bank capacity to a respective module-side controller at each of the plurality of battery modules. The controllers receive, in response to the sending from each respective module-side controller, a state of charge (SOC) of the associated battery module relative to the calculated battery bank capacity, and manage the one or more bank-wide operational parameters based at least in part upon the received SOCs.

Another embodiment of the disclosure is directed to a battery module arranged with a heterogeneous battery module configuration and operated by a module-side controller. The module-side controller identifies a set of performance levels for a set of performance attributes of the battery module and reports, to at least one electrical controller, the set of performance levels. The module-side controller receives, from the at least one electrical controller in response to the reporting, one or more bank-wide operational parameters that are based on a differential between the set of performance levels of the battery module and one or more corresponding sets of performance levels for one or more other battery modules in the battery bank. The module-side controller then implements one or more module-specific control functions for the battery module based on the one or more bank-wide operational parameters.

BRIEF DESCRIPTION OF THE DRAWINGS

A more complete appreciation of embodiments of the disclosure will be readily obtained as the same becomes better understood by reference to the following detailed description when considered in connection with the accompanying drawings, which are presented solely for illustration and not limitation of the disclosure, and in which:

FIG. 6 illustrates a schematic of communication sequences in accordance with an embodiment of the battery management system.

DETAILED DESCRIPTION

Embodiments of the disclosure are provided in the following description and related drawings. Alternate embodiments may be devised without departing from the scope of the disclosure. Additionally, well-known elements of the disclosure will not be described in detail or will be omitted so as not to obscure the relevant details of the disclosure.

Energy storage systems may rely upon batteries for storage of electrical power. For example, in certain conventional electric vehicle (EV) designs (e.g., fully electric vehicles, hybrid electric vehicles, etc.), a battery housing mounted into an electric vehicle houses a plurality of battery cells (e.g., which may be individually mounted into the battery housing, or alternatively may be grouped within respective battery modules that each contain a set of battery cells, with the respective battery modules being mounted into the battery housing). The battery modules in the battery housing are connected in series via busbars to a battery junction box (BJB), and the BJB distributes electric power provided from the busbars to an electric motor that drives the electric vehicle, as well as various other electrical components of the electric vehicle (e.g., a radio, a control console, a vehicle Heating, Ventilation and Air Conditioning (HVAC) system, internal lights, external lights such as head lights and brake lights, etc.). The BJB may be under the control of an internal bank controller while a host interface controller may manage the distribution of the electric power from the battery banks.

Figure 1:
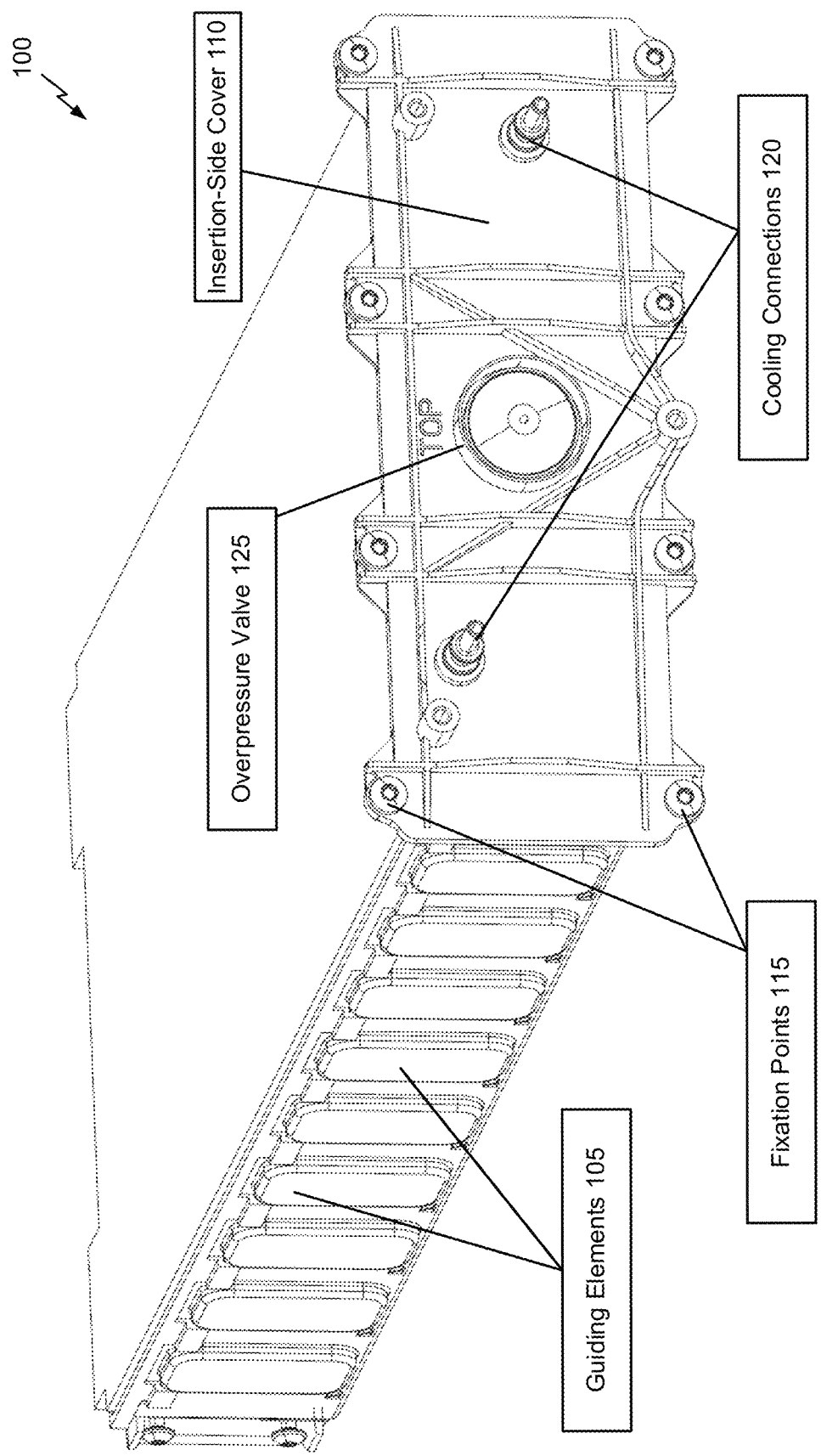
FIG. 1 illustrates a front-perspective of an exterior framing of a battery module in accordance with an embodiment of the disclosure.
Figure 2A:
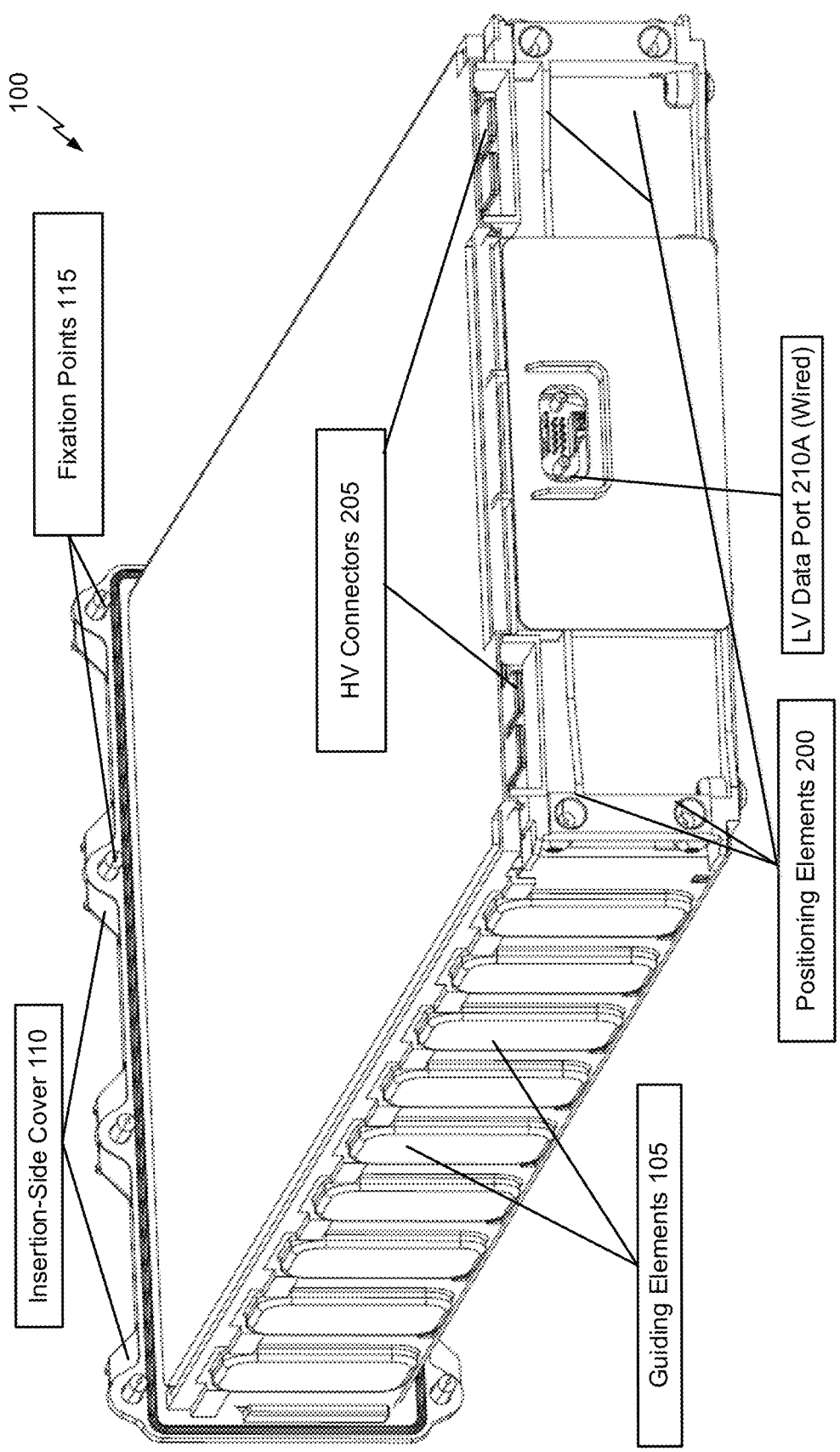
FIGS. 2A-2B illustrate alternative back-perspectives of the exterior framing of the battery module of FIG. 1 in accordance with an embodiment of the disclosure.
Figure 2B:
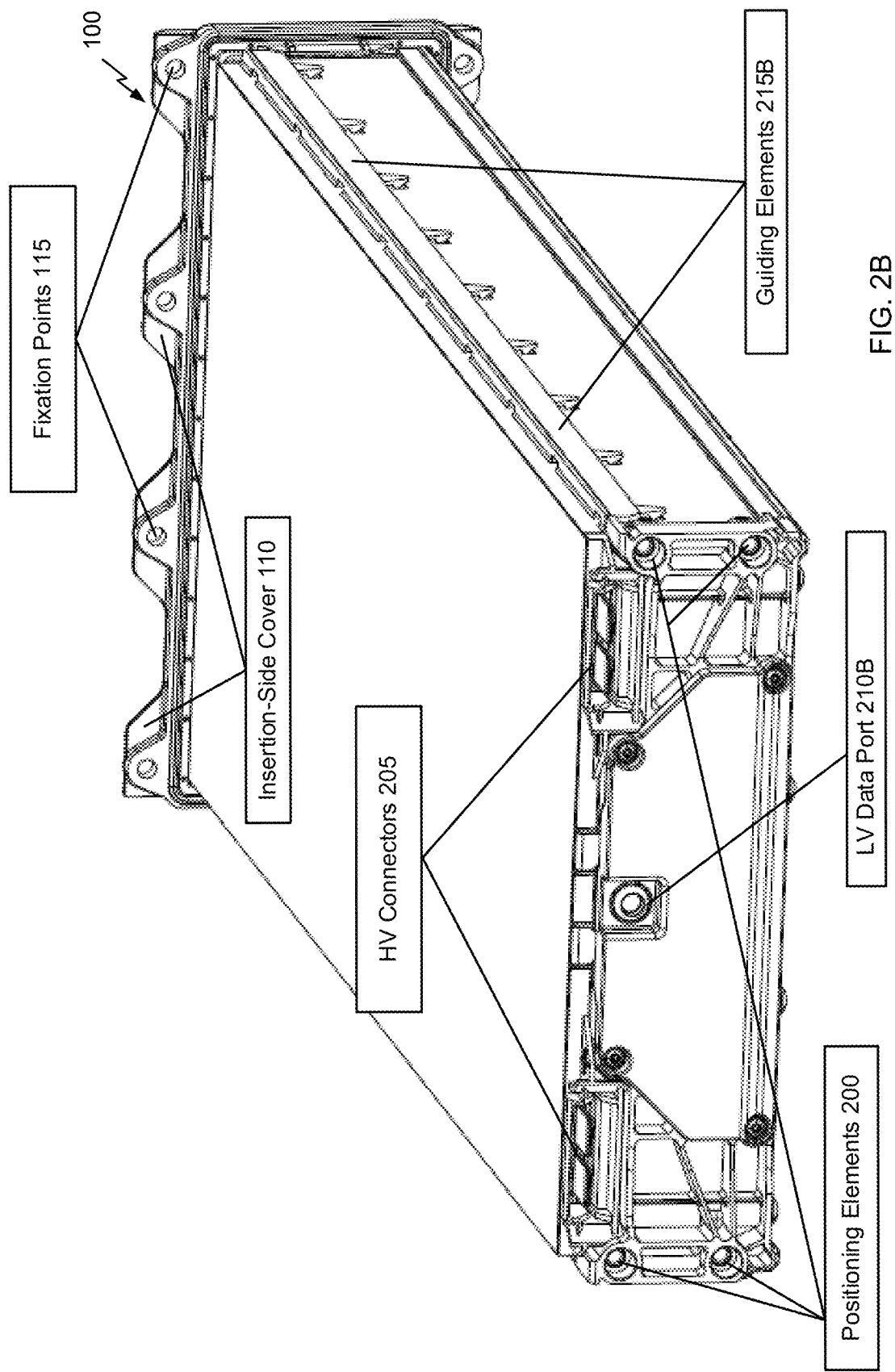

FIG. 1 illustrates a front-perspective of an exterior framing of a battery module 100 in accordance with an embodiment of the disclosure. FIGS. 2A-2B illustrate alternative rear-perspectives of the exterior framing of the battery module 100 in accordance with embodiments of the disclosure. In the examples of FIGS. 1-2B, the battery module 100 is configured for insertion into a battery module compartment. For example, in FIGS. 1-2B, each side of the battery module 100 includes guiding elements 105 or 215B to facilitate insertion into (and/or removal out of) the battery module compartment. In a further example, the guiding elements 105 or 215B are configured to fit into grooves inside the battery module compartment to facilitate insertion and/or removal of the battery module 100. An insertion-side cover 110 (or endplate) is integrated into the battery module 100. Upon insertion, the insertion-side cover 110 may be attached or affixed to the battery module compartment (e.g., via fixation points 115, such as bolt-holes, etc.) to seal the battery module 100 inside the battery module compartment using a cover (or endplate) integrated sealing system (e.g., rubber ring, paper gasket, sealant adhesive, etc.). While the insertion-side cover 110 is depicted in FIGS. 1-2B as integrated into the battery module 100, the insertion-side cover 110 may alternatively be independent (or separate) from the battery module 100, with the battery module 100 first being inserted into the battery module compartment, after which the insertion-side cover 110 is attached.

Referring to FIGS. 1-2B, the insertion-side cover 110 includes fixation points 115, a set of cooling connections 120, and an overpressure valve 125. In an example, the fixation points 115 may be bolt-holes through which bolts may be inserted, and the set of cooling connections 120 may include input and output cooling tube connectors (e.g., through which coolant fluid is pumped into the battery module 100 for cooling one or more cooling plates). The overpressure valve 125 may be configured to open when pressure inside of the battery module 100 exceeds a threshold (e.g., to avoid an explosion or overpressure by degassing in case of a thermal run away of a battery cell in the battery module 100).

In an alternative embodiment, the fixation points 115 and associated flange can be omitted, and a different fixation mechanism (e.g., a clip or clamp, such as a U-shaped clip) can be used to secure the battery module 100 inside a respective battery module compartment. For example, the insertion-side cover 110 may be clamped over the open insertion-side of the battery module compartment with a sheet metal band. The "band" may be rolled over the insertion-side cover 110 to cover part of the top and bottom of the battery housing, after which the rolled band is clamped (e.g., with a U-shaped clip). In an example, as a security feature, removing the rolled band so as to detach the insertion-side cover 110 may cause the rolled band to be damaged, such that unauthorized battery module removal can be detected (e.g., to void a vehicle warranty, etc.).

Referring to FIGS. 2A-2B, the battery module 100 further includes a set of fixation and positioning elements 200 (e.g., to position and secure the battery module 100 in the battery module compartment while inserted), and a set of HV connectors 205 (e.g., corresponding to positive and negative terminals of the battery module 100, each of which may be connected to (e.g., plugged into, bolted or screwed to, etc.) an electrical interface that is coupled to either the BJB or another battery module). In FIG. 2A, the battery module includes a wired LV data port 210A (e.g., to connect internal sensors of the battery module 100 to the BJB (not shown in FIG. 2A) via a wired LV module-to-tunnel interface (not shown in FIG. 2A) in the battery module compartment). In FIG. 2B, the battery module includes an optional optical LV data port 210B (e.g., to connect internal sensors of the battery module 100 to the BJB (not shown in FIG. 2B) via an optical LV module-to-tunnel interface (not shown in FIG. 2B) in the battery module compartment, such as a light tube). In an example, the optical LV data port 210B, upon insertion of the battery module 100 into the battery module compartment, may be pressed against the optical LV module-to-tunnel interface (not shown in FIG. 2B) so that optical signals can be exchanged with the BJB through light tube(s) in the tunnel space without collecting dust or other debris. Accordingly, the battery module 100 is configured such that, upon insertion into the battery module compartment, the fixation and positioning elements 200, and the HV connectors 205 and the LV data port 210A or 210B are each secured and connected (e.g., plugged into, or pressed against and sealed) corresponding connectors in the battery module compartment. As used herein, reference to "LV" and "HV" is used to distinguish between data connections (i.e., LV) and power connections (i.e., HV). Generally, power connections are associated with higher voltages (e.g., suitable for powering a drive motor of an electric vehicle), while data connections are associated with lower voltages (e.g., suitable for transporting data). The optional optical LV data port 210B may be eliminated or replaced by an electrical port. Thus, the low voltage data connections 210A and 210B may be co-axial cable connections, electrical plug-to-connect connections, or other data connection interfaces (e.g. universal serial bus, serial).

Various embodiments of the disclosure described herein relate to module-to-module power connectors between battery modules (e.g., such as the battery module 100 of FIGS. 1-2B) of an energy storage system. As will be described below, module-to-module power connectors may be arranged in part within a tunnel space that is defined above a battery module mounting area, while also including electrical interfaces (e.g., plugs or sockets) that extend downwards into the battery module mounting area for establishing electrical connections with HV connectors (e.g., HV connectors 205 in FIGS. 2A-2B). In an example, module-to-module power connectors may be used to connect at least one pair of battery modules in adjacent battery module compartments together in series.

Figure 3A:
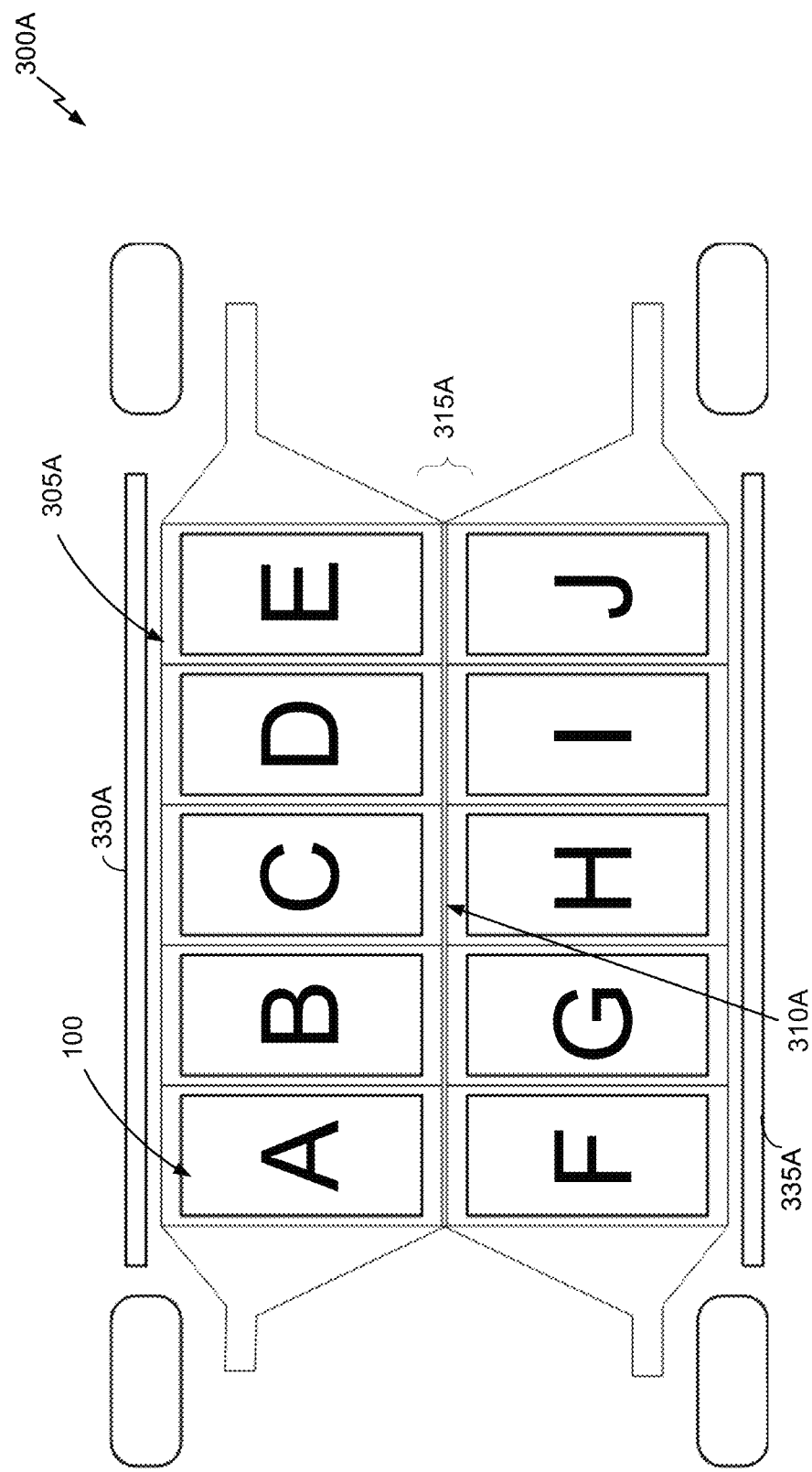
FIG. 3A illustrates a top-perspective of a cross-section of an electric vehicle including a battery housing in accordance with an embodiment of the disclosure.

FIG. 3A illustrates a top-perspective of a cross-section of an electric vehicle 300A including a battery housing 305A in accordance with an embodiment of the disclosure. FIG. 3A depicts various well-known components (e.g., wheels, axles, etc.) of the electric vehicle 300A to provide general context, but these components are not described in detail below for the sake of brevity. With respect to FIG. 3A and other FIGS. described below, reference to battery "housing" and battery "module mounting area" is somewhat interchangeable. The battery module mounting area in FIG. 3A (and other FIGS. described below) refers to an arrangement of battery module compartments configured to receive insertion of battery modules and to be sealed via insertion-side covers to form a battery housing. Further, in at least one embodiment, the battery module mounting area is part of a floor of the electric vehicle 300A.

Referring to FIG. 3A, the battery housing 305A includes ten battery module compartments denoted as A . . . J, and a middle bar 310A that is positioned between battery module compartments A . . . E and battery module compartments F . . . J on different longitudinal sides (e.g., left and right sides) of the electric vehicle 300A. Each battery module compartment includes a frame (or plurality of walls) defining an interior space configured to fit a respective battery module, and an insertion-side which may be opened to facilitate insertion and/or removal of the respective battery module. The middle bar 310A may be constructed from the dividers (or firewalls) that separate laterally adjacent (e.g., aligned width-wise as a left/right pairing in the electric vehicle 300A) battery module compartments A . . . J (e.g., the firewall between battery module compartments A and F, the firewall between battery module compartments B and G, etc.).

In an example, the middle bar 310A may be one single longitudinal "bar" that extends across the entirety of the battery housing 305A. In this case, the interior side-walls of each battery module compartment may be attached to the middle bar 310A to form the battery module mounting area. In an alternative example, each laterally adjacent battery module compartment pair may be pre-constructed as a battery module compartment chamber with its own chamber-specific firewall for separating its respective laterally adjacent battery module compartments. The battery module compartment chambers may be stacked longitudinally to form the battery module mounting area. In this case, the middle bar 310A is an aggregation of the individual firewalls contained in each respective battery module compartment chamber across the battery housing 305A.

While the middle bar 310A is illustrated in FIG. 3A as being centered in the battery housing 305A, the middle bar 310A can be positioned in other locations (e.g., closer to one side or the other, so as to fit differently-sized battery modules on left and right sides of the battery module mounting area) in other embodiments. Further, multiple middle bars could be deployed in other implementations. For example, a particularly wide vehicle may be equipped with a battery module mounting area that is wider than the lengths of two battery modules, such that a gap may be present between the two battery modules when inserted into a laterally adjacent pair of battery module compartments. In this case, two separate firewalls may be used for each laterally adjacent battery module compartment so that respective battery modules can comfortably fit therein, with a gap in-between the two firewalls. The two firewalls may form part of two separate "middle" bars (even though each respective firewall may be offset from a center or middle of the battery housing 305A), with the two separate middle bars either corresponding to two long "bars" extending across the battery housing 305A or two aggregations of chamber-specific firewalls from longitudinally stacked battery module compartment chambers. In at least one embodiment, the gap between the two separate middle bars may be used as a tunnel space (e.g., to facilitate optical communication, to run LV/HV busbars, etc.), although the embodiments describe below relate to an implementation where the tunnel space is defined above the battery module compartments, and not in a gap between laterally adjacent battery module compartments.

It will be appreciated that the battery housing 305A including ten battery module compartments A . . . J is shown in FIG. 3A for example purposes only. For example, an electric vehicle with a longer wheel base may be configured with a battery housing having more battery module compartments (e.g., 12, 14, etc.), while an electric vehicle with a shorter wheel base may be configured with a battery housing having fewer battery module compartments (e.g., 8, 6, etc.). The battery module compartments A . . . E are arranged longitudinally (i.e., lengthwise with respect to electric vehicle 300A) on a right-side of the electric vehicle 300A, while battery module compartments F . . . J are arranged longitudinally on a left-side of the electric vehicle 300A.

As used herein, a "battery module" is a package that contains a plurality of battery cells, such as Li-ion battery cells or battery cells made from a different electrode material. Battery modules may be configured with a prismatic or pouch battery cell arrangement (sometimes referred to as a soft pack), while other battery modules are configured with a cylindrical battery cell arrangement.

As used herein, a battery module compartment being "sealed" refers to a seal that is at least water-tight or liquid-tight, and optionally gas-tight (at least, with respect to certain gases and/or particles such as smoke from fire, carbon, electrolyte particles, dust and debris, etc.). Generally, the sealing of the battery module compartments is a result of its interior walls being welded or glued together (where possible), and any connection interfaces (e.g., insertion-side cover, coolant interface plugs, electrical interfaces, etc.) being sealed with a suitable type of sealant (e.g., O-ring, rubber gasket, sealing compound, etc.). While the sealing of the battery module compartments could potentially be hermetic (e.g., gas-tight with respect to all gases), hermetic sealing is not necessary (e.g., due to high cost). Accordingly, the sealing of the battery module compartments may be configured to block propagation of likely contaminants (e.g., liquids such as water, flames and/or smoke from fires, carbon, electrolyte particles, dust and debris, etc.) from entering into battery module compartments from an external environment and/or from exiting the battery module compartments towards a protected area (e.g., a passenger cabin of an electric vehicle). Moreover, while various embodiments described below relate to lateral or side-insertion of battery modules into respective battery module compartments, the insertion-side for the battery module compartments A . . . J may vary between different battery module mounting area configurations.

Referring to FIG. 3A, the middle bar 310A is configured to increase the overall stiffness of the battery housing 305A (and thereby, the electric vehicle 300A). In an example, the middle bar 310A may be positioned underneath a tunnel space 315A that, similar to the middle bar 310A, may be centered between battery module compartments A . . . E and battery module compartments F . . . J. As noted above, the battery module compartment firewalls that comprise the middle bar 310A limit propagation of hazards (e.g., excessive heat or fire, fluid leaks, etc.) between battery module compartments A . . . E and battery module compartments F . . . J. The tunnel space 315A optionally permits wireless communication (e.g., optical communication) between the battery modules inserted into the battery compartments A . . . J and the BJB (not shown in FIG. 3A). In an example, the tunnel space 315A may be outside of the battery module compartments A . . . J and effectively on 'top' of the battery housing 305A in the middle of the electric vehicle 300A (e.g., along the top of middle bar 310A). Alternatively, instead of being defined over, or on 'top', of the battery housing 305A, the tunnel space 315A may instead be vertically aligned (or level) with the battery modules A . . . J in the battery housing 305A in-between adjacent battery module compartments on different lateral sides of the electric vehicle 300A (e.g., two interior walls or firewalls are used to seal each pair of laterally adjacent battery module compartments, with spaces in-between each pair of laterally adjacent battery module compartments defining the tunnel space 315A).

While not shown expressly in the top-perspective depicted in FIG. 3A, busbars contained within respective module-to-module power connectors may be deployed along the tunnel space 315A to provide electrical connections between battery modules inserted into any of the battery module compartments A . . . J and a BJB.

Figure 3B:
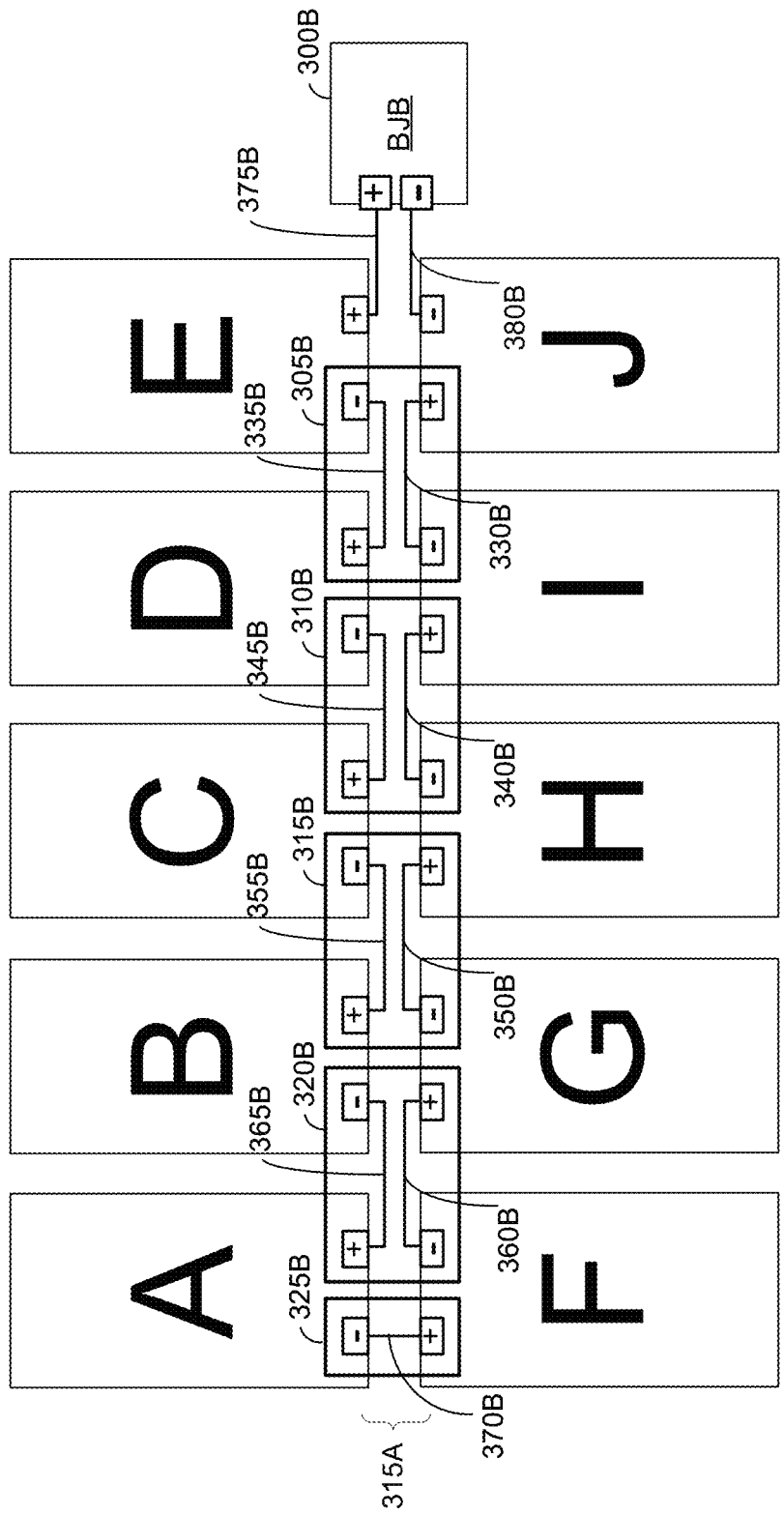
FIG. 3B illustrates an electrical diagram from a top-perspective of a cross-section of the electric vehicle of FIG. 3A in accordance with an embodiment of the disclosure.

FIG. 3B illustrates an electrical diagram from a top-perspective of a cross-section of the electric vehicle 300A in accordance with an embodiment of the disclosure. Referring to FIG. 3B, a BJB 300B is arranged at one end of the tunnel space 315A near battery module compartments E and J. A negative terminal at the BJB 300B may connect to an electrical interface on battery module compartment J via an HV busbar (e.g., a sealed HV busbar), which is connected to a negative terminal of a battery module in battery module compartment J. A positive terminal of the battery module in battery module compartment J in turn connects to an electrical interface on battery module compartment J, which connects to an HV busbar that connects to an electrical interface on battery module compartment I, which is connected to a negative terminal of a battery module in battery module compartment I, and so on. In this manner, the battery module in battery module compartment J may be daisy-chained in series to the battery module in battery module compartment I, which is in turn daisy-chained (in order) to battery modules in battery module compartments H, G, F, A, B, C, D and E, with the positive terminal of the battery module in battery module compartment E being connected back to the BJB 300B via an HV busbar to complete the HV power connection between the BJB 300B and the respective battery modules of the battery housing 305A.

Referring to FIG. 3B, the electrical interfaces and associated busbars that are used to form electrical connections between battery modules in adjacent battery module compartments are integrated into module-to-module power connectors 305B-325B. These interfaces and battery modules may be managed by an internal bank controller as illustrated in FIG. 5C. In FIG. 3B, module-to-module power connectors 305B-320B are implemented as "paired" module-to-module power connectors in the sense that two separate busbars are included to form two separate in-series module-to-module electrical connections. For example, module-to-module power connector 305B includes a first busbar that facilitates an in-series electrical connection between battery modules in battery module compartments I and J, and also a second busbar that facilitates an in-series electrical connection between battery modules in battery module compartments D and E. In an example, the respective busbars in each "paired" module-to-module power connector are insulated from each other as each respective busbar is configured to connect a different pair of battery modules in series. By contrast, module-to-module power connector 305B-320B is implemented as a "single" module-to-module power connector in the sense that a single busbar is included to form a single in-series module-to-module electrical connection between battery modules in battery module compartments A and F.

Referring to FIG. 3B, module-to-module power connectors 305B-320B are each configured to connect battery modules in longitudinally-adjacent battery module compartments on the same longitudinal side of the battery housing 305A. For example, module-to-module power connector 305B is configured to connect battery modules in longitudinally-adjacent battery module compartments I and J in series and also to separately connect battery modules in longitudinally-adjacent battery module compartments D and E in series. By contrast, module-to-module power connector 325B is configured to connect battery modules in laterally-adjacent battery module compartments A and F in series.

Referring to FIG. 3B, each of the module-to-module power connectors 305B-325B may include one or more busbars (e.g., HV busbars) for transporting power between battery modules in adjacent battery module compartments. In FIG. 3B, these busbars are denoted as 330B-370B. In an example, some or all of the busbars 330B-370B may include an integrated disconnect component. Each of the integrated disconnect components is part of or affixed to a respective busbar in a module-to-module power connector, and is configured to reduce or eliminate a voltage across a respective electrical connection in response to a trigger (e.g., a surge in current, heat, etc., which may be caused in a crash scenario). As will be described below in more detail, the integrated disconnect components may include fuses, explosive components (e.g., pyro fuses, etc.), or the like. Also depicted in FIG. 3B are HV busbars 375B-380B. HV busbars 370B-380B each connect a single battery module to the BJB 300B, and thereby may be characterized as part of module-to-BJB power connectors instead of module-to-module power connectors. Similar to the module-to-module power connectors described above, the HV busbars 370B-380B in the module-to-BJB power connectors may be sealed.

While not shown in FIG. 3B, each battery module compartment may also include an LV module-to-tunnel interface (e.g., an optical communications interface, a wired communications interface, etc.) which facilitates a connection between the battery module and the BJB 300B.

In an example, centering the busbars (e.g., HV busbars 330B-380B and/or LV busbars) along the tunnel space 315A in the middle of the electric vehicle 300A helps to isolate the busbars from crash impact zones (e.g., the left and right sides of the electric vehicle 300A), which in turn protects the busbars from crash impact-related damage. Also, defining the tunnel space 315A on top of the middle bar 310A, which may be configured as a strong metal 'spine' of the battery housing 305A, may likewise help to protect the busbars with the tunnel space 315A functioning as a relatively protected area (e.g., from crash impact-related damage, etc.). The tunnel space 315A may also function as an electromagnetic shield that protects the busbars from external electromagnetic interference. In an example, the busbars may be attached to a top-portion of the battery module compartments in proximity to the firewall(s), so that the tunnel space 315A remains substantially empty, which may facilitate LV busbars or an optical communications interface to be deployed therein. The central busbars may include LV (or data) busbars (not shown) and HV (or power) busbars (e.g., busbars 330B-380B), as noted above, although the LV busbars may be omitted if an optical communications interface (e.g., a light tube) is implemented (e.g., because LV wiring is not required to communicate with the individual battery modules).

With respect to the embodiment whereby the tunnel space 315A is defined on 'top' of the battery housing 305A, in an example, each pair of laterally adjacent battery module compartments may include a set of holes located proximately to the tunnel space 315A and aligned perpendicular to a direction in which the battery module is inserted or removed (e.g., for lateral or side-insertion, the holes may be on an upper wall or top wall of the battery module compartment). Electrical interfaces of the module-to-module power connector(s) are mounted into respective hole(s) among the set of holes for connecting battery modules to the busbars 330B-370B in the tunnel space 315A. For example, each module-to-module power connector may be mounted in the tunnel space 315A on top of the battery housing 305A, with respective electrical interfaces extending downwards and being inserted into one or more respective holes, and then secured and sealed. Then, when a battery module is inserted into a battery module compartment, electrical interfaces (e.g., plugs, sockets, etc.) for positive and negative terminals of the battery module are aligned with the electrical interfaces (e.g., plugs, sockets) on the module-to-module power connector(s), such that the electrical interfaces of the battery module are coupled to the electrical interfaces on the module-to-module power connector(s) upon full insertion into the battery module compartment, and the electrical interfaces of the battery module are disconnected (or decoupled) from the on the module-to-module power connector(s) when the battery module is removed from the battery module compartment. Alternatively, instead of an implementation where the battery modules are plugged into module-to-module power connector(s) upon insertion, the HV busbars in the module-to-module power connectors could instead manually secured to the electrical interface(s) on the battery modules. For example, an HV busbar could be bolted to an electrical interface on a battery module and then covered or sealed via a separate cover. In this case, the electrical interface of the module-to-module power connector to the battery module would correspond to the portion of the HV busbar that is bolted onto the battery module's electrical interface (e.g., in contrast to a plug/socket mechanism for forming electrical connections between the module-to-module power connectors and battery modules).

In an example, the electrical interfaces on the module-to-module power connector(s) may interface with battery modules on both sides of the battery module mounting area. For example, module-to-module power connector 305B connects battery modules in battery module compartments I and J in series on one longitudinal side of the battery housing 305A, while also connecting battery modules in battery module compartments D and E in series on the other longitudinal side of the battery housing 305A. The electric couplings of the battery modules can be chained from battery module compartment to battery module compartment with HV being available at the BJB 300B once a last battery module is inserted (e.g., each of battery module compartments A . . . J).

The electrical interfaces on each module-to-module power connector 305B-325B may be sealed (e.g., via a plastic cover, a rubber gasket, a sealing adhesive, a sealing ring such as an O-Ring in an axial or a radial direction, etc.) so that each battery module compartment is sealed from an external environment (e.g., so that no liquid can entered into or escape from the battery housing 305A once all the battery module compartments are closed). In an example, this sealing is not applied between the battery modules that are electrically connected via the electrical interfaces of the module-to-module power connectors 305B-325B (e.g., gaps may be defined inside the module-to-module power connectors 305B-325B to permit airflow between the respective adjacent battery modules). In an example, the module-to-module power connectors 305B-325B may be secured onto the top of the battery housing 305A in the tunnel space 315A via bolting or screwing.

In an example, positioning the module-to-module power connectors 305B-325B on the battery housing 305A in the tunnel space 315A may permit workers (e.g., assembly workers at a vehicle assembly plant during assembly of the electric vehicle 300A, maintenance workers, etc.) access to a particular subset of battery module compartments without being exposed to dangerously high voltages. For example, as noted above, the busbars 330B-370B of the respective battery module compartments may be positioned in an interior or central portion of the electric vehicle 300A, while the workers may be located outside the electric vehicle 300A for a lateral module insertion scenario, thereby shielded from the centrally-positioned busbars 330B-370B.

In particular, during insertion of a battery module that includes an integrated cover (or endplate), the worker may insert the battery module into a battery module compartment and couple the battery module to at least one corresponding busbar (e.g., via electrical interfaces of one or more module-to-module power connectors, where the battery module coupling may occur by virtue of the worker pushing or sliding an electrical interface of the battery module into the corresponding electrical interfaces of one or more module-to-module power connectors), and then secure (e.g., by tightening bolts, etc.) the cover (or endplate) to the battery module compartment so that the battery module compartment is sealed. Likewise, during removal, the worker may free or unlock the cover attachment mechanism (e.g., by removing bolts, etc.), and may then slide the battery module out of the battery module compartment. Hence, in at least one embodiment, during either insertion or removal, the worker only accesses the battery module(s) inside one particular subset of battery module compartments and its associated busbar(s) at a time without exposing the workers to the central HV busbars 330B-370B.

In an embodiment, the BJB 300B may also be positioned in a middle or center (laterally) at one longitudinal end of the electric vehicle 300A on top of the battery housing 305A. For example, to simplify and/or shorten power cabling and improve safety, the BJB 300B may be positioned at one longitudinal end of the battery housing 305A above the battery module compartments E and J, or alternatively at the other longitudinal end of the battery housing 305A above the battery module compartments A and F). In an example, positioning the BJB 300B in the middle (laterally) of the electric vehicle 300A above the tunnel space 315A may reduce an electrical connection length between the BJB 300B and the battery modules due to the busbars 330B-370B being run along the tunnel space 315A. However, it will be appreciated that the BJB 300B can be placed anywhere in the electric vehicle 300A and is not required to be installed proximately to the battery housing 305A at the precise location depicted in FIG. 3B.

The battery housing 305A described above with respect to FIGS. 3A-3B may be based on various battery module mounting area configurations, such as a lateral-inserted battery module mounting area configuration (e.g., battery modules are inserted into a battery module mounting area from the left and right sides of an electric vehicle) which is used to describe various embodiments below. However, while not expressly illustrated, other battery module mounting area configurations are possible, such as vertically-inserted battery module mounting area configurations (e.g., battery modules are inserted into a battery module mounting area from the top or bottom sides of an electric vehicle), hinged-inserted battery module mounting area configurations (e.g., battery module compartments are attached to hinges so that the battery module compartments rotate upwards and downwards via the hinges for battery module insertion), and so on.

Figure 4A:
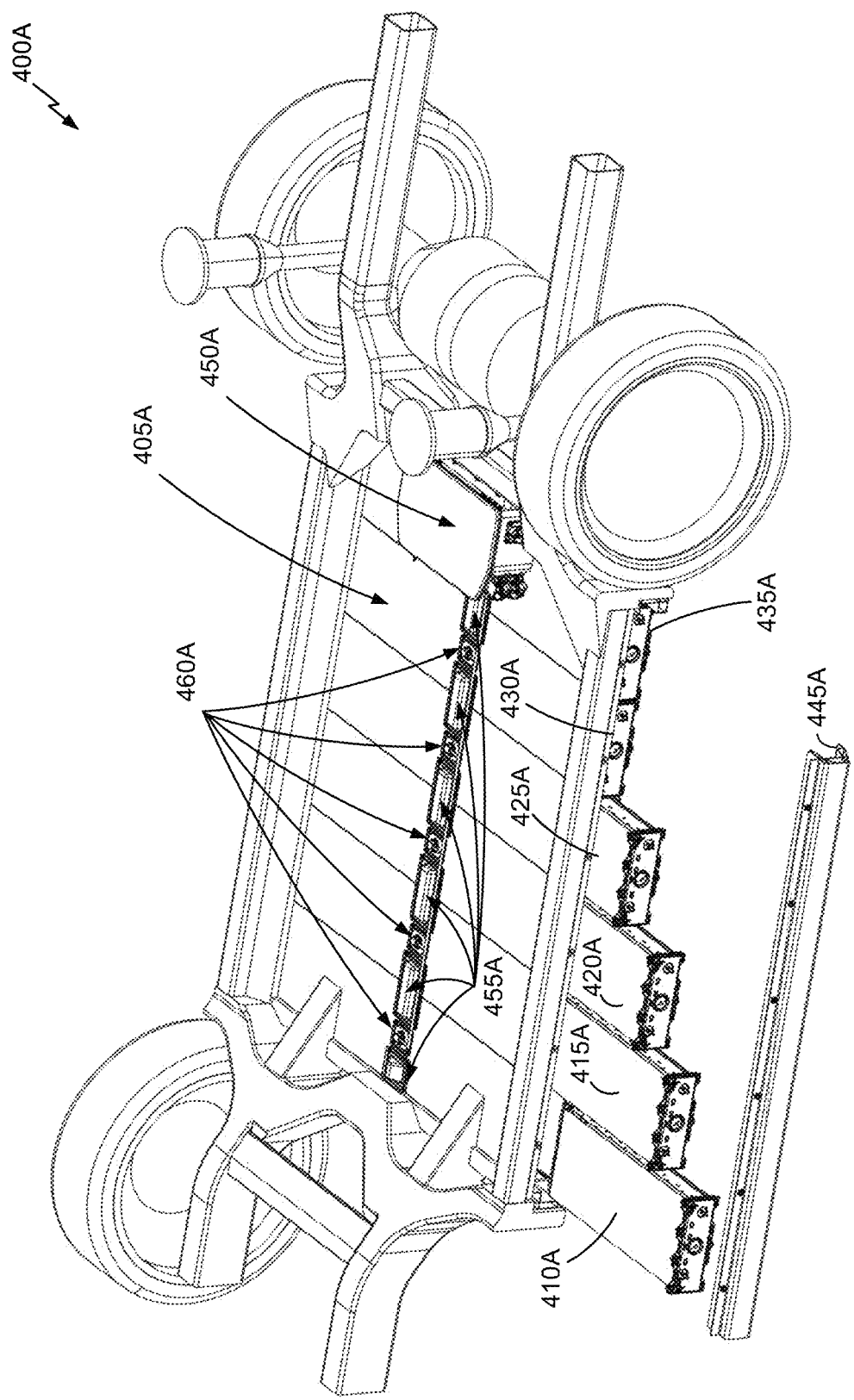
FIGS. 4A-4B illustrate examples whereby module-to-module power connectors are arranged between battery modules of an electric vehicle in accordance with embodiments of the disclosure.
Figure 4B:
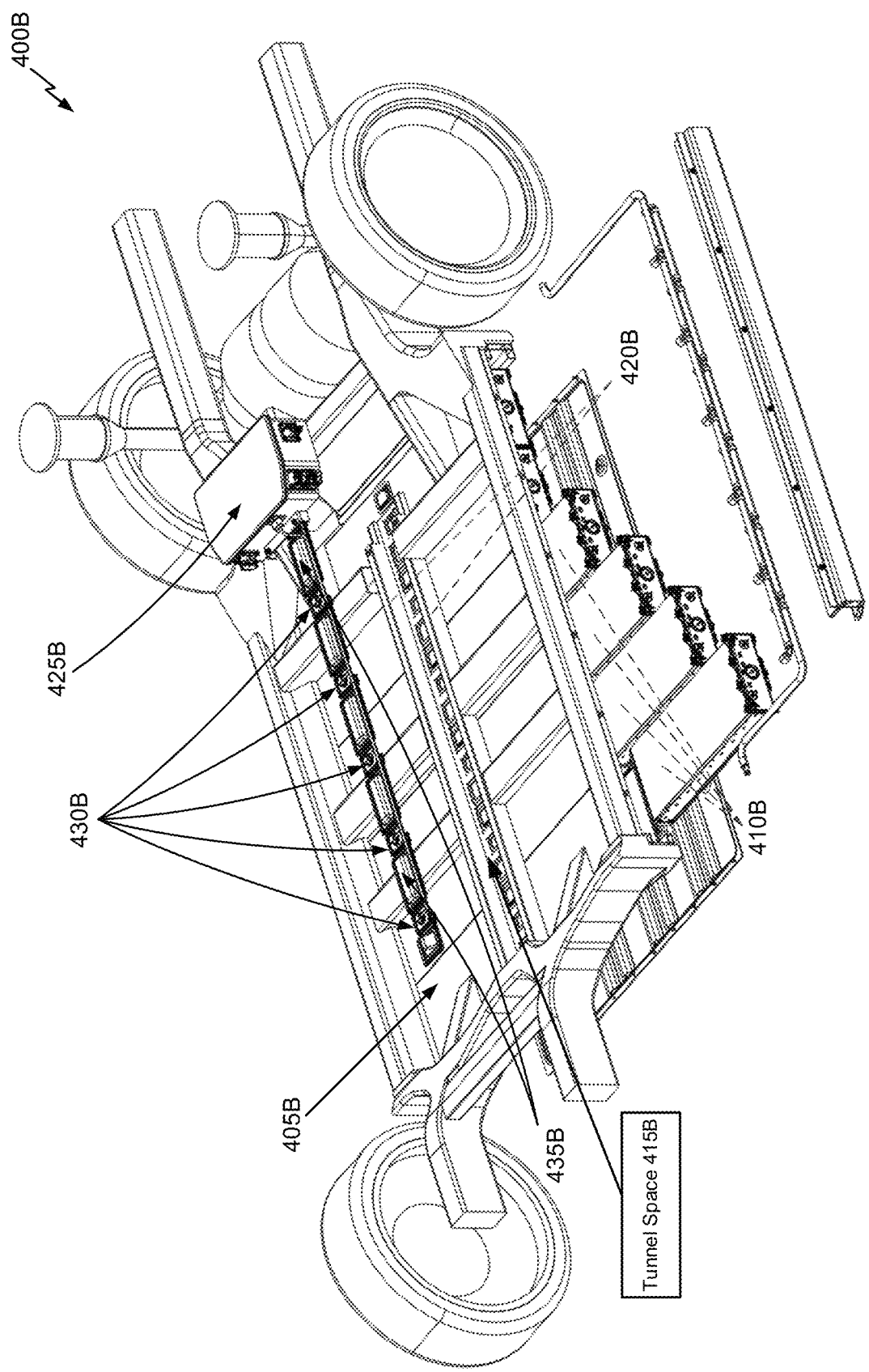

FIGS. 4A-4B illustrate examples whereby module-to-module power connectors are arranged between battery modules of an electric vehicle in accordance with embodiments of the disclosure. In particular, FIGS. 4A-4B illustrate examples specific to a lateral-inserted battery module mounting area configuration for a battery housing of an electric vehicle.

Referring to FIG. 4A, an electric vehicle chassis 400A includes a battery module mounting area 405A that includes, on a left side of the electric vehicle chassis 400A, battery module compartments configured to receive battery modules 710A-735A via left-side lateral insertion. In FIG. 4A, battery modules 410A-425A are shown at different degrees of lateral insertion, while battery modules 430A-435A are shown in a fully-inserted state. While not shown explicitly in FIG. 4A, the battery module mounting area 405A may further include, on a right side of the electric vehicle 400A, battery module compartments configured to receive other battery modules 410A-435A via right-side lateral (or side) insertion. More specifically, the insertion-sides of the battery modules 410A-435A correspond to the left exterior-facing lateral side of each respective battery module compartment on the left side (longitudinally) of the electric vehicle 400A, and the insertion-sides of the battery modules of each respective battery module compartment on the right side (longitudinally) correspond to the right exterior-facing lateral side of the electric vehicle 400A. Rocker panel 445A may be attached to the electric vehicle 400A.

Referring to FIG. 4A, a BJB 450A is mounted on top of the battery module mounting area 405A, and is electrically connected to the battery modules 410A-435A (and also the right-side battery modules, which are not shown explicitly in FIG. 4A) via module-to-module power connectors 455A. Further, a battery module controller, such as that illustrated in FIG. 5, coupled to the BJB 450A is communicatively coupled to each battery module via LV busbars 460A. Although in other embodiments an optical communications interface (e.g., a light tube, etc.) may be used for coupling. While not shown expressly in FIG. 4A, the module-to-module power connectors 455A and LV busbars 460A may each be deployed in a protected tunnel space 415B as illustrated in FIG. 4B.

Referring to FIG. 4B, another electric vehicle chassis 400B is depicted with a battery module mounting area 405B. Various battery modules 410B are shown at various degrees of insertion into the battery module mounting area 405B. A tunnel space 415B is defined above the battery module mounting area 405B by a set of center-mounted bars 420B. Further shown in FIG. 4B is a BJB 425B that is configured to be connected to the various battery modules via both LV busbars 430B and module-to-module power connectors 435B. While not shown expressly in FIG. 4B, the LV busbars 430B and module-to-module power connectors 435B may be installed inside of the tunnel space 415B, and then sealed (e.g., via bolting or screwing onto the top of the battery module mounting area 405B). Also, while the BJB 425B, the LV busbars 430B and the module-to-module power connectors 435B are shown as floating above the battery housing components in FIG. 4B, it will be appreciated that this is for convenience of illustration as the BJB 425B is installed adjacent to the tunnel space 415B and the LV busbars 430B and the module-to-module power connectors 435B are installed inside the tunnel space 415B. The module-to-module power connectors 435B may be managed by an internal bank controller that manages the power flow of the battery modules 410B.

While the module-to-module power connectors in the embodiments describe above are used to form serial connections between battery modules in respective battery module compartments to ramp up the voltage level being supplied to the BJB 300B, in alternative embodiments, some or all of the module-to-module power connectors may instead be configured to form parallel connections between the battery modules in respective battery module compartments to increase current instead. Accordingly, the specific type of connection formed by the module-to-module power connectors may vary by implementation depending on whether higher current or higher voltage is desired.

Figure 5A:
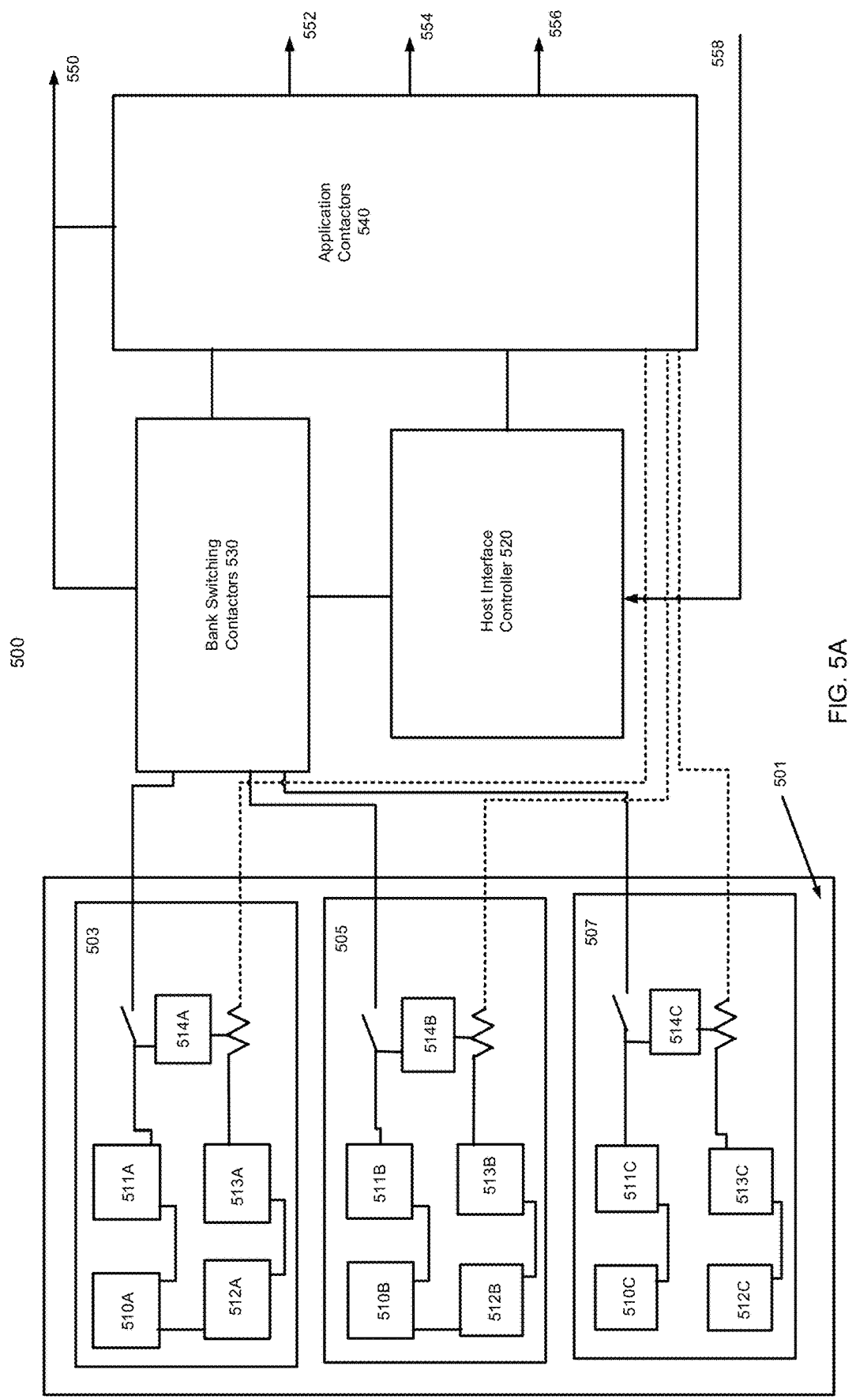
FIG. 5A illustrates a high-voltage control system schematic in accordance with an embodiment of the battery management system.

FIG. 5A illustrates a schematic of a high-voltage control system 500 in accordance with an embodiment of the battery management system.

Figure 5B:
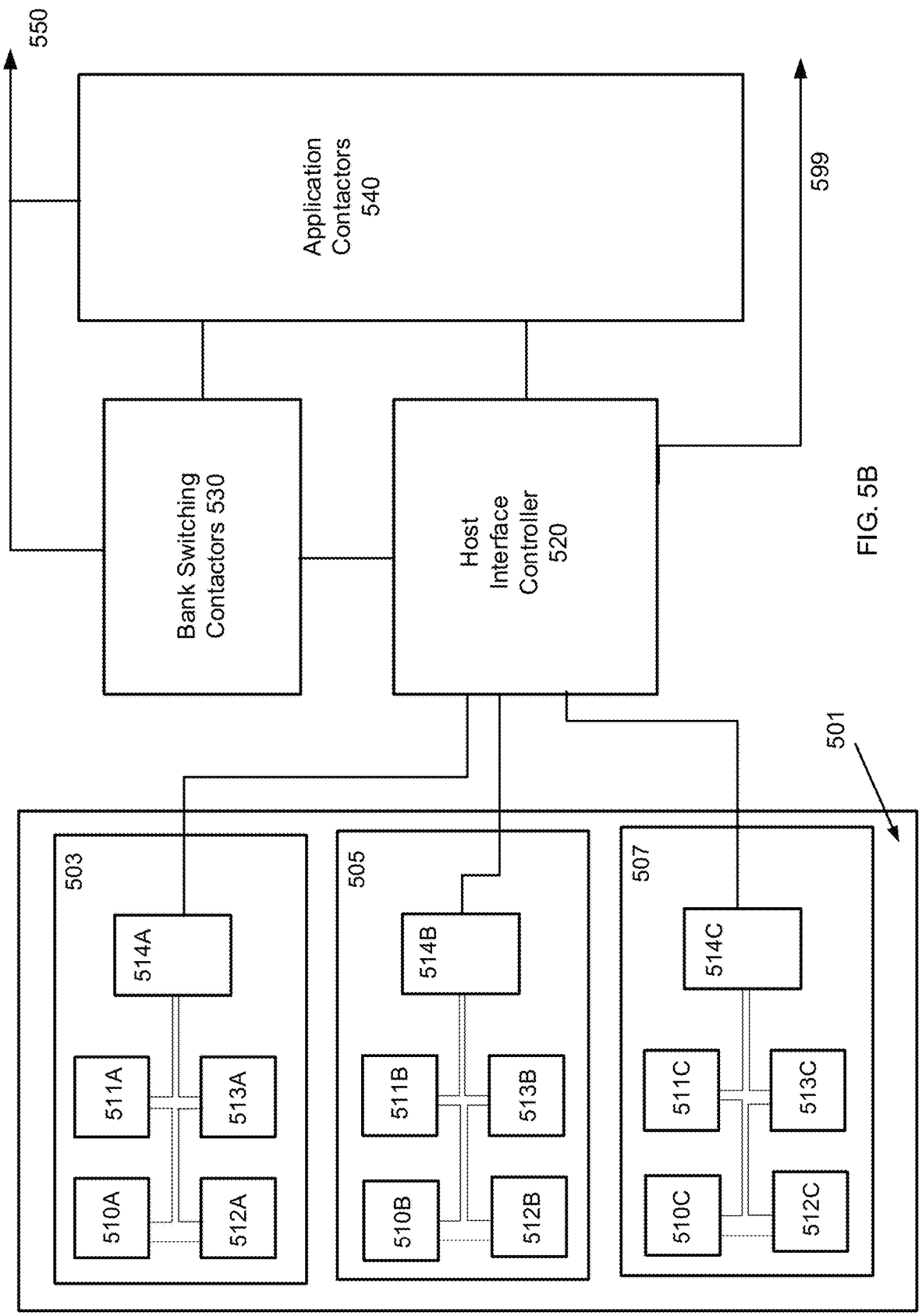
FIG. 5B illustrates a low-voltage communication schematic in accordance with an embodiment of the battery management system.
Figure 5C:
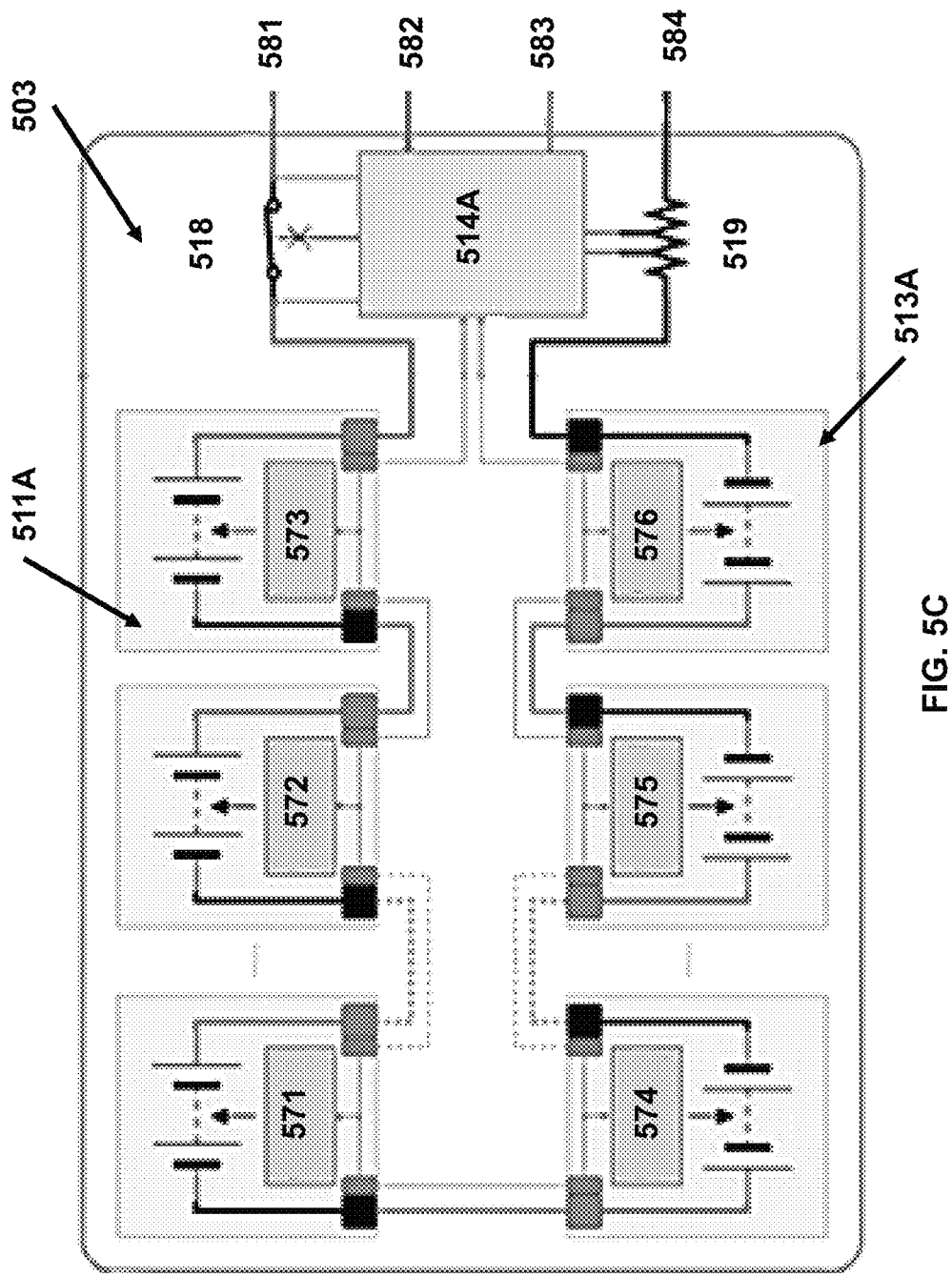
FIG. 5C illustrates a system schematic of high voltage and low voltage connections in a bank of battery modules in accordance with an embodiment of the battery management system.

Referring to FIG. 5A, the schematic shows the high-voltage power connections carry energy from the battery modules 510A-513A, 510B-513B, and 510C-513C to vehicle systems. The battery modules 510A-513A are arranged in a battery bank 503; the battery modules 510B-513B are arranged in battery bank 505; and the battery modules 510C-513C are arranged in a battery bank 507. Together these three battery banks 503, 505 and 507 may form part of a vehicle power system 501 or other power supply. The low voltage communications connections between controllers is shown in FIG. 5B. The high voltage and low voltage connections within each bank are illustrated in more detail in FIG. 5C.

A battery bank such as battery banks 503, 505, and 507 may include an internal bank controller 514A, 514B, or 514C, respectively. The internal bank controller 514A of battery bank 503, for example, may control the current flow to and from the battery bank 503 via a switch on one terminal and a variable resistor on the other terminal. The internal bank controller may communicate directly with the modules in a bank, and may include a current shunt and Coulomb counter on the primary circuit for monitoring those modules which are connected in series. The internal bank controller may also be referred to herein as a junction box, a switch box, a BJB, or a S-Box, or may be a part of these hardware components. The battery modules themselves may be connected in series within a battery bank. The negative terminals of each bank are illustrated in dotted lines and extend to the application contactors 540 which may be implemented as a switching device for applying or receiving power at 552, 554, and 556. The host interface controller 540 may also receive power via auxiliary connection 558 that may be used to pass on power further to other controllers and modules.

In one implementation, the vehicle systems or loads may be vehicle power 552 and an AC/DC or DC/DC converter 556 while the inputs may be battery charger 554. The switch and resistor controlled by the internal bank controller 514A, for example, may regulate the battery bank 503 and provides coordination between modules and interacts with the module-level controllers. The control architecture of the battery bank is shown in more detail in FIGS. 5B and 5C. Here the internal bank controller 514A has voltage and current control over the high-voltage connections of the outgoing terminals.

The positive terminals of the battery banks 503, 505, and 507 connect to the bank switching contactors 530 which may be implemented as a series of switches controlled by a microcontroller for regulating power to/from the various battery banks. The bank switching contactors 530 may be controlled by the host interface controller 520 which acts as a central control unit of the battery management system 500. The host interface controller 520 may also control the switching of the application contactors 540. The bank switching contactors 530 along with the application contactors 540 may receive control signals from safety interlock 550. The host interface controller 520 is a control unit that provides adaptation for one or more battery banks to the specific application (e.g. a car, truck, stationary storage). The host interface controller may have direct control of typical application specific features such as safety contactors, charging, and connectivity to the vehicle control unit (e.g. ECU).

The host interface controller 520 also transfers auxiliary voltage power to the positive and negative terminals of each battery bank 503, 505, and 507. These power lines are not shown in FIG. 5A, but they operate to provide power from the vehicle to the host interface controller 520. The host interface controller 520 receives power over these lines and acts as a switch, preferably in place of the bank switching contactors 530 and the application contactors 540, to control the auxiliary power as needed. This redundant power may be at a lower voltage or current than one or more of the normal operating loads, vehicle power 552 or DC/DC converter 556.

FIG. 5B illustrates a low-voltage communication schematic in accordance with an embodiment of the battery management system.

Referring to FIG. 5B, the battery banks 503, 505 and 507 are illustrated along with an information or control signal flow over different wires or routes than those of the high-voltage power flow of FIG. 5A. Alternatively, or in some cases, the information flow illustrated may be transmitted via modulation of the current along one or more of the high-voltage paths and detected by the various controllers connected to the high-voltage system. In either case, the modules 510A-513A may be connected in series by the information network as illustrated in FIG. 5B.

FIG. 5B shows the low-voltage (LV) communication connectivity. The connections within the module are shown as a ring configuration connecting the modules in series like the high voltage connections. The connection between modules may also be a hub and spoke configuration with the module controllers or a bus configuration. The low-voltage connections may follow the same topology of the high-voltage primary circuit which connects each of the modules in series.

The host interface controller 520 may function as the head of the network of controllers. In particular, the controls or feedback for various battery banks 503, 505 and 507 may originate or terminate at the host interface controller 520, respectively. The host interface controller 520 may also transmit control signals to the bank switching contactors 530 and the application contactors 540 to control switch arrangements or settings. The host interface controller 520 may be a dedicated power control or battery management circuit or processor. Alternatively, the host interface controller 520 may be integrated with the electronic control unit (ECU) of a vehicle.

The information flow as illustrated in FIG. 5B may be hierarchical. That is control decisions which may be made locally (e.g. within a module or bank) are managed by the local controller (e.g. internal bank controller 514A). Likewise, monitoring or feedback data may be filtered by each successive level of controllers such that only the information needed by higher-level controllers is forwarded on. Each level of controllers may re-characterize or re-package data gathered by lower level controllers or monitoring devices. The host interface controller 520 may not be the highest level of controller and may receive power distribution commands, switch control instructions, or power mode changes from a vehicle ECU, or an engine controller of a vehicle. Furthermore, the host interface controller 520 may receive information or feedback from monitoring circuits in the bank switching contactors 530 and the application contactors 540.

Together the host interface controller 520 and the internal bank controllers 514A-C may operate as a gateway between module level controllers and monitoring circuits and the vehicle ECU. As a gateway, the internal bank controllers 514A-C and the host interface controller 520 may translate, repackage, compress, filter, or otherwise convert data for use by other parts of the network (e.g. application contactors 540). This is particularly important in heterogeneous implementations where battery banks from different suppliers or manufactures may have different monitoring circuits or transmission protocols. As a result of the virtualization of the bank by the internal bank controllers, the host interface controller 520 will observe or connect to the bank as a homogeneous battery bank. In the case of heterogeneous battery banks (e.g. 503 differs from 505 on a higher level than the modules), the host interface controller 520 may perform other interoperability functions. Similarly, if battery modules such as 511A or 511C are upgraded or refurbished (particularly if not the original equipment manufacturer—non-OEM), the internal bank controller may perform the interoperability functions for these modules.

In some implementations of the gateway, the bank switching contactors 530 and the application contactors 540 may be included in the gateway. The bank switching contactors 530 may be open to receiving various protocols for control without translation by the host interface controller 520. In particular, these switch banks may receive commands from various upstream controllers (e.g. ECUs) with different protocols with or without passing the commands through the host interface controller 520. The internal bank controllers and host interface controller in the battery management system may be hardware or software or a combination thereof, including application specific circuits (ASICs), field programmable gate arrays (FPGAs), or processors configured with executable software instructions, and other implementations.

At the module level, the series connections shown provide connection not only to the internal bank controller 514A, for example, but may also connect each module to the others in the battery bank so that cooperation and balancing can be managed at the modular or sub-bank level. Furthermore, because the modules may be connected via dedicated information connections, the connections need not mirror the series connections of the power or high-voltage connections. Instead, for instance, the information or low-voltage network for the modules (e.g. 510B-513B) may be implemented in parallel connection so that pairs (e.g. 510B and 512B) or other groupings of modules may be controlled together. This may provide efficiencies and reduce costs. Furthermore, the wired connections of the modules and/or the internal bank controllers may be replaced by wireless connections, or other data link connections. In particular, the host interface controller 520 may connect to the vehicle for additional external communication via line 599.

FIG. 5C illustrates a system schematic of high voltage and low voltage connections in a bank of battery modules in accordance with an embodiment of the battery management system.

The implementation illustrated in FIG. 5C provides a detailed view of the data links and high-voltage connections within a single battery bank (here battery bank 503). Importantly, battery bank 503 is illustrated as having N battery modules (where N is any integer) as indicated by the ellipses between the end modules. Any of the battery banks 503, 505 or 507 of FIGS. 5A and 5B may be implemented with one or more modules. Furthermore, each bank of the power system 501 need not have the same number of modules. Indeed, one of the advantages of this battery management system is that it can handle heterogeneous battery banks and/or battery modules. The cells of each module (e.g. 511A) are shown on both sides of the arrow with the electrical symbol for a battery. The battery bank 503 may be a battery bank as illustrated FIG. 3B with the module-to-module power connectors 305B-325B also shown (but not labeled) in FIG. 5C connecting the modules 511A and 513A in series with other modules.

In particular, FIG. 5C illustrates cell module controllers 571-576 provided with each of the modules and each connected between the positive and negative terminals of the module. Thus, the cell module controllers 571-576 may be powered by the battery cells under management. Likewise, the detailed view of the battery module 503 in FIG. 5C illustrates another layer: the battery cell architecture. Any number of cells may be implemented in each module. The number of cells may impact energy storage capacity and output voltage, but may be handled by the heterogeneous battery management system. The cells may be further characterized by their chemical make-up (e.g. Li-ion, Li-polymer, lead acid).

The cell module controller 573, for example, may be configured to store or detect a cell model for the cells under management in the respective module 511A. The cell model may predict or characterize the discharge curves, charging curves, thermal limits, optimal operating ranges for current draw, temperature and switching, the number of cells, and/or the performance deterioration with age. In addition, the cell module controller 573 may be configured to detect one or more of these battery cell parameters and build or refine the cell model. The cell module controller 573 and others in the battery management system may be hardware or software or a combination thereof, including application specific circuits (ASICs), field programmable gate arrays (FPGAs), or processors configured with executable software instructions, and other implementations.

The cell module controllers may connect to one or more cells in the module to detect the voltage across the cell and other functional parameters. Likewise, the cell module controllers may selectively remove cells from contributing to the module via a shunt or other switchable bypass. This may extend the life of module 511A as cells deteriorate. The cell module controller may know the chemistry of the cells and the arrangement or grouping of cells. The cell module controllers may also use various switching techniques to balance the load needed from the battery module 511A over one or more cells in the module. In particular, the output voltage of a module may be adjusted by switching one or more cells from a series configuration to a parallel configuration. The cells may be of a cylindrical, prismatic, or pouch format.

The cell module controller 573 may also encode, record, or regularly transmit the operational limits (e.g. amp hours) of the battery module 511A to the host interface controller 520 or internal bank controller 514A. Since these operational limits may change with time, the cell module controller 573 may connect to one or more monitoring circuits or detectors within the battery module 511A to measure or derive the operational limits. A few of these operational limits may include: current limits for charging and discharging under pulse or continuous charge/discharge, maximum and minimum voltage limits, thermal limits for operation and idling, the state of charge, and the state of health. Importantly, if the battery module 511A is determined to be near, at or over an operational limit the cell module controller may initiate a bypass procedure to bypass the cells of the module while leaving the series connection of the bank connected. The bypass procedure may be conducted in conjunction with nearby modules (e.g. 513A) or the internal bank controller 514A. Other corrective actions include cell rebalancing, cell shutdown, cell recharging, and other cell level adjustments.

Ultimately, for heterogeneous modules or cells, the cell module controller may operate to abstract the module and underlying cells to one or more standardized module formats or abstract the module as cells of a battery. A battery module may be composed of homogeneous battery cells that are combined into parallel groups (P) and the connected in series (S), such that a module has S×P cells. Thus in some cases, interoperability may include the cell module controller 573 functioning to appear to upstream controllers as a simple battery cell while improving functionality and performance of the cells within the module 511A. The abstraction or virtualization of the module as conforming to a smaller set of standard cells or modules allows more interoperability with third-party systems and protocols at higher levels of abstraction within the management system. For instance, a newly replaced battery module may be virtualized by the cell module controller 573 to mimic the age of nearby modules or an age set by the internal bank controller 514A. As a result, the organization of the cells in the module and their chemistry are not required to be known or detectable outside the module or to higher-level controllers.

The internal bank controller 514A also connects to the bank switching contactors 530 via high voltage I/O 581 and 584, with contact 581 being the positive terminal and contact 584 being the negative terminal. The internal bank controller 514A provides a data communication link with the host interface controller via low voltage communication line 582.

Additionally, the internal bank controller 514A outputs to an auxiliary power line 583 which may bypass the bank switching contactors 530 and connect directly to the host interface controller 520 which then may supply auxiliary power to the vehicle in certain situations or modes (e.g. after engagement of the safety interlock).

The internal bank controller 514A, like the other internal bank controllers, may provide a current shunt emergency shutdown and a Coulomb counter 519 to monitor the flow of charge out of the battery bank 503, and provide a pyro switch 518 for a safety disconnect on the positive terminal 581 that is activated by temperature or other fire indicators. The current shunt is shared and used by all modules. That is, the current measurement is done by each internal bank controller as well as Coulomb counting. These measurements are made available to all modules for coordination. In this way the modules themselves do not carry the component cost of these two items. The pyro-switch 518 can be used for emergency one-time disconnect should the internal bank controller 514B determine this is necessary. The pyro-switch may also be activated by over-current conditions or over-voltage conditions, which may indicate a fault in the bank or are reasonably likely to cause a fire.

At the next level of control or management, the internal bank controller 514A also provides an abstraction for the battery bank 503 of modules. Using the abstracted data from each module, the internal bank controller 514A, for example, may calculate the battery bank's capacity, discharge curve, or current limits. Other operational limits and parameters may also be calculated from the information obtained from the cell module controllers. As can be seen in FIG. 5A, the main current circuits of each battery bank 503, 505 and 507 are routed through the respective internal bank controllers 514A-C. Likewise, the information flow of data from the battery modules 511B and 513B, for example, is routed through the respective internal bank controller 514B as seen in FIG. 5B.

Thus, the internal bank controller 514B not only has a view of module and bank performance from the data received from the cell module controllers but also from the actual current and voltage passing under its control. The internal bank controller 514B may also transmit information back to the cell module controllers, such as the battery bank capacity. Any of the internal bank controllers may transmit the bank capacity, bank voltage, the bank temperature, bank discharge current limits (pulse/continuous) per temperature, bank charge limits (pulse/continuous) per temperature, and the bank thermal limits.

Figure 5D:
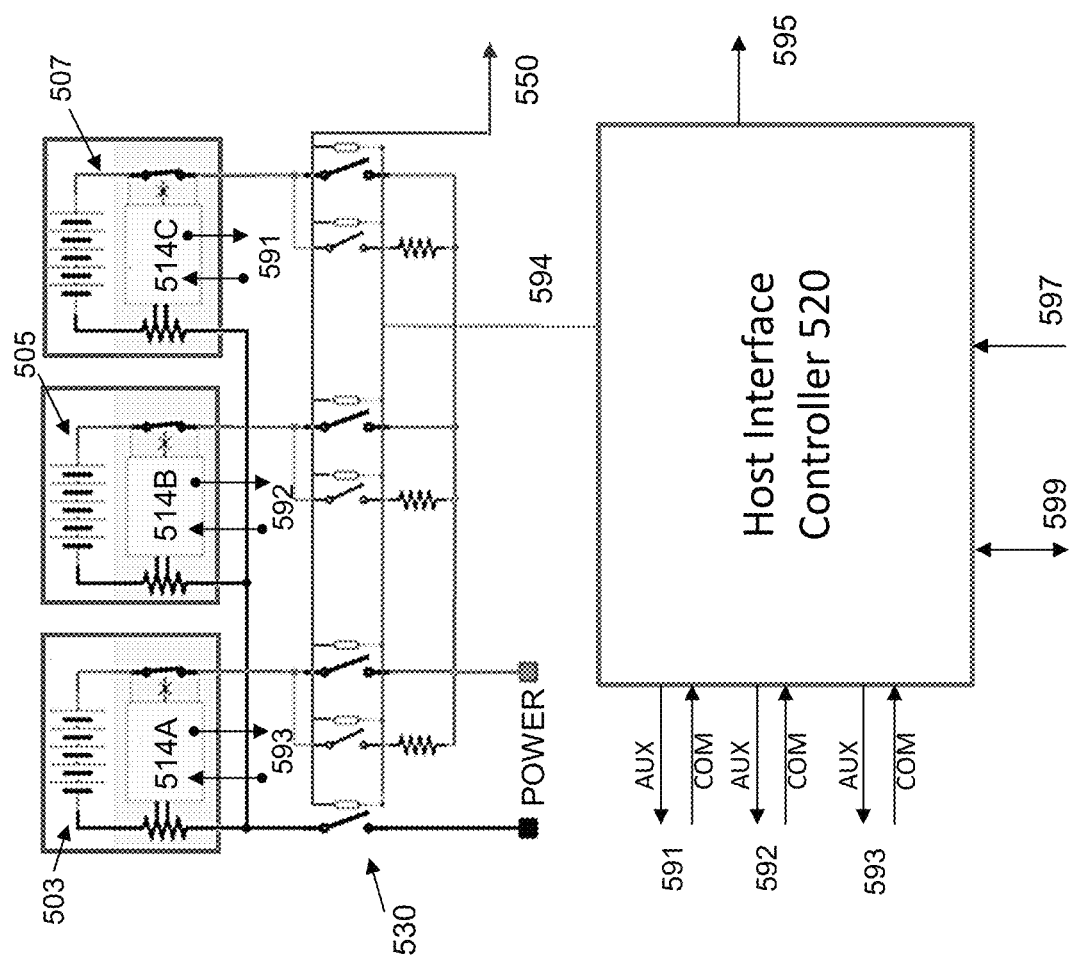
FIG. 5D illustrates a host interface controller and a bank switching contactor and their connections in accordance with an embodiment of the battery management system.

FIG. 5D illustrates a host interface controller and a bank switching contactor and their connections in accordance with an embodiment of the battery management system.

Referring to FIG. 5D, the inputs to the host interface controller 520 are illustrated as well as an exemplary electrical structure of the bank switching contactors 530 according to one implementation. The bank switching contactors 530 has a high voltage switch for each of the three battery banks 503, 505 and 507 of FIG. 5A. The switches may be controlled by the power control line 594 connecting the host interface controller 520 to the bank switching contactors 530. In addition, the switches may be controlled by the safety interlock 550. The bank switching contactors 530 outputs to POWER which may be a high voltage connection to the vehicle or to the application contactors 540. The host interface controller 520 may select only one battery bank, such as battery bank 505, at a time so that the other battery banks 503 and 507 operate to extend the range of the vehicle but not the power supplied.

As described in FIG. 5C, the internal bank controllers have two outputs in addition to the bank power outputs 581 and 584. Specifically, communication line 582 and auxiliary power input 583 from the host interface controller 520 are illustrated in FIG. 5D with respect to battery bank 503 as connections 591. The other banks 505 and 507 also have these connections 592 and 593 respectively. Furthermore, the host interface controller 520 is illustrated as having connections 591, 592 and 593 with each having two connections. Each of the inputs 591-593 provides an auxiliary power connection to the internal bank controllers 514C, 514B and 514A, respectively. These auxiliary power connections may be always on in the sense that they may always draw power from the vehicle to power the controllers. In addition, the auxiliary power connections may be under the control of the host interface controller 520 such that auxiliary power from the vehicle via power input 597 has a certain voltage. Thus, the host interface controller 520 may contain one or more switches for controlling this auxiliary power.

The host interface controller 520 also receives data feeds from internal bank controllers 514A-C via connections 591-593. In particular, the host interface controller 520 may receive information on the bank capacity, the bank voltage, the bank current limits, bank current discharge limits (pulse/continuous) per temperature, bank current charge limits (pulse/continuous) per temperature, bank temperature, and bank thermal limits. The host interface controller 520 may transmit at least a portion of this information to vehicle computers or engine controllers (e.g. bank capacity) via the communication link. The host interface controller 520 may also receive and execute commands from communication link 599. For example, the host interface controller 520 may determine or may receive instructions to switch between battery banks, control the bank contactors 530 or the application contactors 540, to switch to charging mode, fast charging mode, sport discharge mode, or lifecycle discharge mode.

The host interface controller 520 may calculate and provide pack limits and range estimation for all battery banks to a vehicle interface via communication link 599. The host interface controller 520 may provide additional thermal management functions including switching battery banks to regulate temperature. The communication connection 595 connects to the application contactors 540 to control switching of power between the various high-voltage vehicle systems connected to the application contactors. The application contactors 540 may be arranged and controlled similar to the switching bank of the bank controller contactors 530 illustrated in FIG. 5D.

FIG. 6 illustrates a schematic of communication sequences in accordance with an embodiment of the battery management system.

Referring to FIG. 6, the schematic illustrates a communication flow between the cell module controllers, internal bank controllers, and the host interface controller 520 of the battery management system 500 according to one implementation. The cell module controllers 571-576, for example, may transmit per module limits (e.g. current limits—Amps) and per module safety limits 610 including thermal limits to the internal bank controller 514A. The internal bank controller 514A may calculate minimum current limits (charge/discharge), bank voltage, bank capacity, and bank thermal limits based on the information 610 received from the cell module controllers. The internal bank controller 514A may transmit periodic updates 620 to the host interface controller 520 including bank capacity and the other parameters calculated by the internal bank controller. The internal bank controller 514A may then transmit back to each cell module controller 571-576 the bank capacity or bank limits as transmission 630 so that the modules may be rebalanced or adjusted. Being able to balance dissimilar modules is critical to optimal utilization of the modules. The rate based approach however is one way, and there are others.

Furthermore, the cell module controllers 571-576 may calculate individually or in cooperation with each other the apparent state of charge of the module based on the bank capacity rather than the initial module capacity calculated. Then the cell module controllers 571-576 transmit the calculated state of charge (SOC) or usable capacity limits per module back to the internal bank controller 514A. The result is that the internal bank controller can represent a set of dissimilar modules as a single set of battery limits to the host interface controller 520. The measurements performed by the cell module controller may be the cell voltage measurement, the temperature of the cells, and a current measurement of the current passing through the module.

In more detail, each P-group (parallel group) of modules or individual modules may perform duty cycle calculations. Based on criteria that include current measurement at the internal bank controller 514A and SOC reporting from each module, the internal bank controller 514A may periodically initiate a balancing rate measurement by informing each cell module controller. Each cell module controller 571-576 may measure the SOC of each P-group in the module and report the minimum apparent SOC for all P-groups to the internal bank controller 514A. The internal bank controller 514A may then identify the minimum apparent SOC across all modules and report the minimum bank-wide P-group SOC to all modules. Each module will adjust the duty cycle of each P-group balancing resistor as a function of the difference between the SOC of the P-group and the minimum P-group for the bank.

A battery management system may perform two types of balancing: active and passive. Active balancing occurs by using cells with high voltages to charge cells with lower voltages thereby reducing the voltage difference between the cells until all cells are closely matched and the battery is fully charged or evenly generating voltage. Passive balancing, which includes P-group cycling, may be performed by providing each cell with a resistor in parallel that gets switched on when the cell voltage is above a threshold. This releases charge from a p-group and may be used to bring the usable discharge capacity in all P-groups to the same level.

As part of a duty cycle leveling function, each module (or cell module controller) may report the minimum duty cycle of its balancing resistor from all P-groups to the internal bank controller 514A, which will then identify the minimum duty cycle across all modules. The internal bank controller 514A may communicate this minimum duty cycle to all modules and all modules in the bank may then level their duty cycles by subtracting this minimum.

Figure 7:
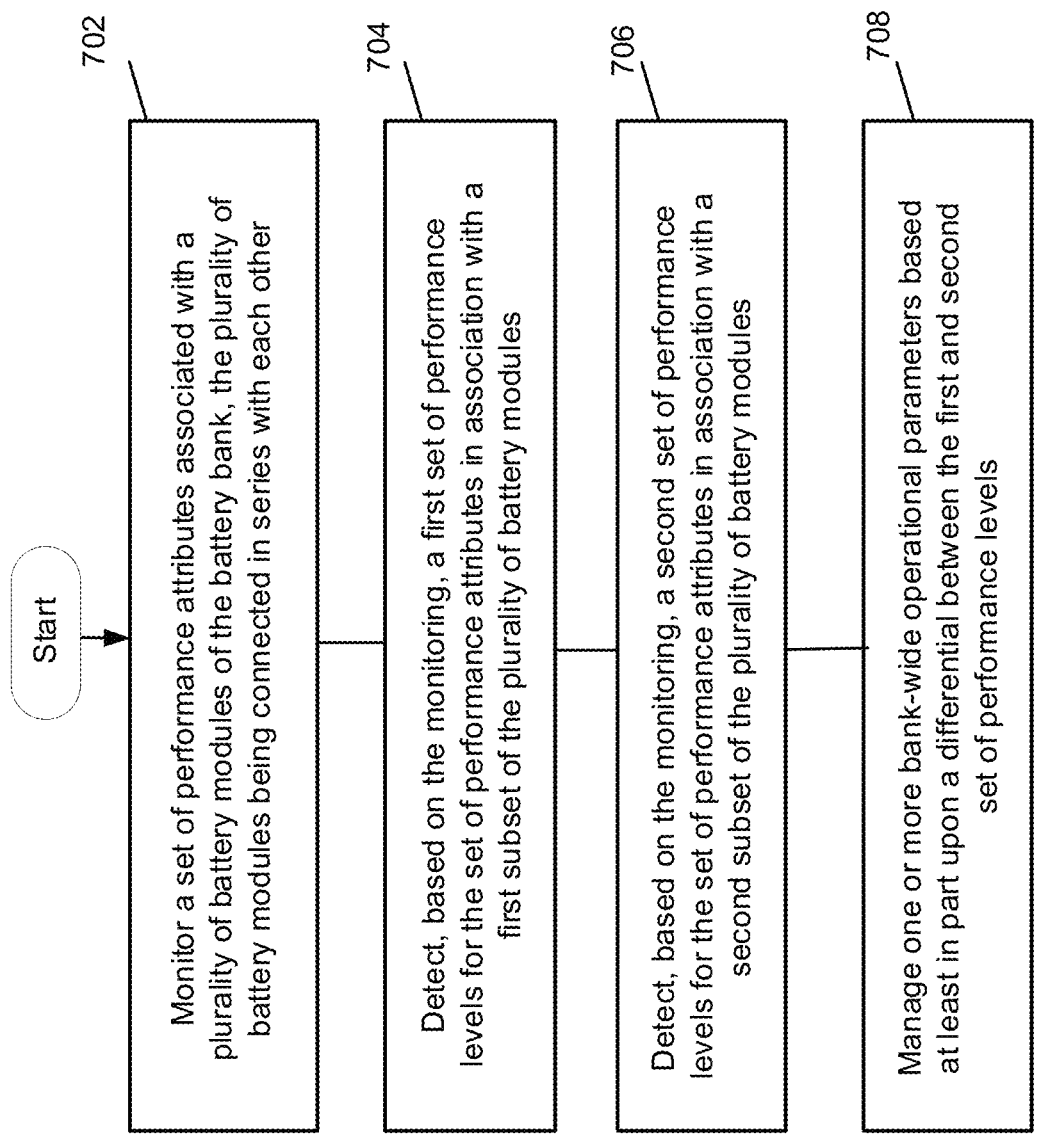
FIG. 7 illustrates a battery management process in accordance with an embodiment of the battery management system.

FIG. 7 illustrates a battery management process in accordance with an embodiment of the battery management system.

A battery management process is illustrated in FIG. 7 according to an implementation of the battery management system 500. The process may start at the initiation of charging, starting of the vehicle, or other initialization sequences. At 702, the system may monitor a set of performance attributes associated with a plurality of battery modules of the battery bank, the plurality of battery modules being connected in series with each other. Examples of monitored performance attributes are noted above with respect to FIG. 5B and FIG. 5C.

At 704, the system may detect, based on the monitoring, a first set of performance levels for the set of performance attributes in association with a first subset of the plurality of battery modules. In particular, the internal bank controller may detect or calculate these performance levels.

At 706, the system may detect, based on the monitoring, a second set of performance levels for the set of performance attributes in association with a second subset of the plurality of battery modules. In particular, the internal bank controller may detect or calculate these performance levels.

At 708, the system may manage or set one or more bank-wide operational parameters based at least in part upon a differential between the first and second set of performance levels. That is, the battery modules may have heterogeneous characteristics which are managed by the battery management system 500, or more specifically the internal bank controller and the host interface controller 250. The one or more bank-wide operational parameters comprises bank-wide capacity, bank-wide voltage, bank-wide discharge current limit, bank-wide charging current limit, bank-wide thermal limit, bank-wide minimum P-Group duty cycle, or any combination thereof.

Each of the plurality of battery modules may include a plurality of parallel groups of battery cells (P-Groups). The set of performance attributes may include a minimum state of charge (SOC) across the plurality of P-Groups for a respective battery module. The set of performance attributes may also include a minimum duty cycle across the plurality of P-Groups for a respective battery module. The one or more bank-wide operational parameters may include one or more bank-wide safety limits. The first set of performance attributes may include one or more module-specific safety limits. The set of performance attributes comprises module-specific capacity, module-specific voltage, module-specific discharge current limit, module-specific charging current limit, module-specific thermal limit, module-specific state of charge (SOC), or any combination thereof.

The battery management system may calculate a capacity of the battery bank based on the first and second set of performance levels and send the calculated battery bank capacity to a respective module-side controller at each of the plurality of battery modules and receive, in response to the sending from each respective module-side controller, a state of charge (SOC) of the associated battery module relative to the calculated battery bank capacity. The system may manage the one or more bank-wide operational parameters based at least in part upon the received SOCs. The battery management system may determine a lowest of the minimum SOCs and send the determined lowest of the minimum SOCs to a respective module-side controller at each of the plurality of battery modules to regulate P-Group duty cycles. The one or more module-specific safety limits may be adjusted to comply with one or more bank-wide safety limits, or the one or more module-specific safety limits may be independent of the one or more bank-wide safety limits.

Figure 8:
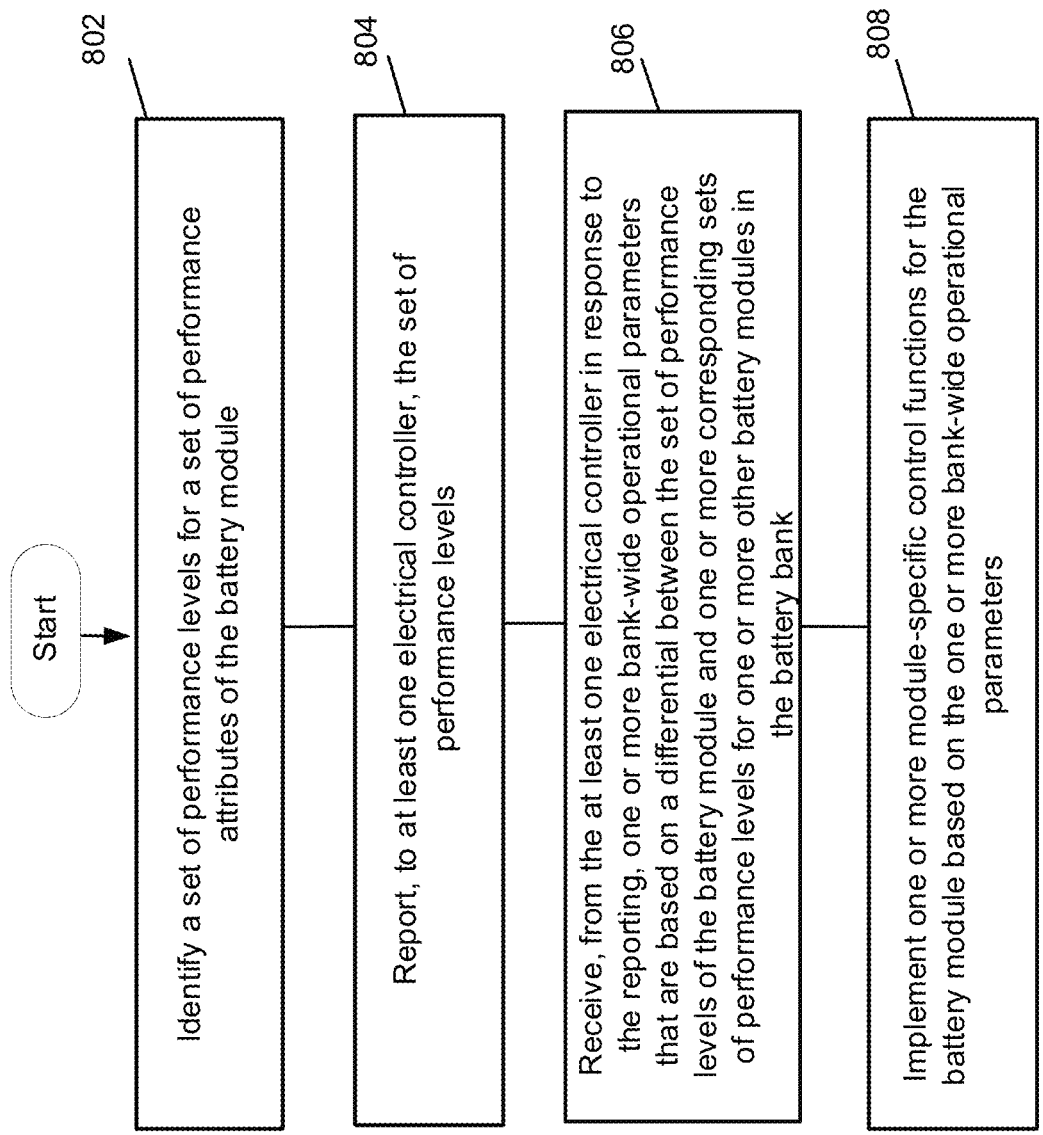
FIG. 8 illustrates a module management process in accordance with an embodiment of the battery management system.

FIG. 8 illustrates a module management process in accordance with an embodiment of the battery management system.

A module-side controller of a battery module of a battery bank arranged with a heterogeneous battery module configuration may manage the battery module according to an exemplary process illustrated in FIG. 8. At 802, the controller may identify a set of performance levels for a set of performance attributes of the battery module. The set of performance attributes may be known or encoded with the module upon manufacture and indicate the battery chemistry and other fixed performance parameters.

At 804, the controller may report, to at least one electrical controller, the set of performance levels. At 806, the controller may receive, from the at least one electrical controller in response to the reporting, one or more bank-wide operational parameters that are based on a differential between the set of performance levels of the battery module and one or more corresponding sets of performance levels for one or more other battery modules in the battery bank.

At 808, the controller may implement one or more module-specific control functions for the battery module based on the one or more bank-wide operational parameters. The controller may determine the correct course of action and rebalance or change the duty cycle of cells in the module based on the bank-wide parameters.

The battery architecture may be based on a set of battery modules that have heterogeneous characteristics with respect to each other. The battery module itself may be built from similar well-matched cells, but no such requirement exists between modules that compose the battery bank. Take for example, a battery bank composed of 5000 cells with each parallel group having 50 cells and 100 parallel groups then stacked in series (called 100S×50P), the stack of cells can evenly be divided into 10 modules of 500 cells each configured similarly with parallel groups of 50 cells (10S× 50P). The battery management approach described above does not require that the modules each have the same number of cells in each parallel group or stack height. In fact, this approach allows very dissimilar modules to be chained together in a battery bank. In practice, however, it may be desirable that the modules be relatively close in capacity. This is, because the capacity of a stack of battery cells in series is limited by the smallest cell in the stack, so that having modules that are very different in capacity will result in a larger share of the battery being unavailable (wasted).

Allowing such heterogeneous modules to be individually replaced over the life of the battery bank presents significant benefits in terms of flexibility of service and maintenance of the battery as well as lifetime cost optimization. The battery bank must ensure the safe operational limits of each composing module (and its composing cells) is maintained via the internal bank controller and may also provide optimal utilization of the energy available in the full bank of modules.

This may be achieved by each module communicating a standard abstract (cell format, chemistry, and age independent) representation to the battery system controller which aggregates the abstracted characteristics across all modules in the bank. The derived bank-wide safety limits and needed operational parameters are then communicated back to each individual module. Finally, an abstract representation of the aggregated set of modules may be reported to the vehicle. The various abstractions allow for a homogeneous management approach of heterogeneous components lower in the hierarchy.

A set of battery modules connected electrically in series may be referred to herein as a bank or battery bank. The primary circuit of these battery modules is routed through an internal bank controller. The modules also share a communications channel (CAN-FD bus) that connects all of the modules with the bank controller. A set of one or more battery banks that are switched in parallel may be referred to as a battery pack (e.g. battery pack 501). Switching between banks is possible during operation but in practice only one bank may be discharged at any time. In this way a second or third battery bank acts to extend range (capacity) in a vehicle scenario, but not its power.

With respect to battery cells and battery modules, the term homogeneous may imply that the composing cells are identical in make and model and likely coming from the same manufacturing batch from a single supplier. The term may also include non-OEM sources of the battery cells. With respect to battery cells, the term heterogeneous may imply that the composing cells are dissimilar in one or more ways: make, model, chemistry, format, state-of-health, or manufacturing batch. With respect to battery modules it may mean that while the cells within any single module are homogeneous, the cells between two modules are heterogeneous with respect to each other.

While the embodiments described above relate primarily to land-based electric vehicles (e.g., cars, trucks, etc.), it will be appreciated that other embodiments can deploy the various battery-related embodiments with respect to any type of electric vehicle (e.g., boats, submarines, airplanes, helicopters, drones, spaceships, space shuttles, rockets, etc.).

While the embodiments described above relate primarily to battery module compartments and associated battery modules and insertion-side covers for deployment as part of an energy storage system for an electric vehicle, it will be appreciated that other embodiments can deploy the various battery-related embodiments with respect to any type of energy storage system. For example, besides electric vehicles, the above-noted embodiments can be applied to energy storage systems such as home energy storage systems (e.g., providing power storage for a home power system), industrial or commercial energy storage systems (e.g., providing power storage for a commercial or industrial power system), a grid energy storage system (e.g., providing power storage for a public power system, or power grid) and so on.

As will be appreciated, the placement of the various battery module compartments in the above-noted embodiments is described as being integrated into a vehicle floor of an electric vehicle. However, it will be appreciated that the general closed compartment profile design may be extended to battery module mounting areas that can be installed in other locations within the electric vehicle (e.g., in a trunk of the electric vehicle, behind one or more car seats, under a front-hood of the electric vehicle, etc.).

The forgoing description is provided to enable any person skilled in the art to make or use embodiments of the invention. It will be appreciated, however, that the invention is not limited to the particular formulations, process steps, and materials disclosed herein, as various modifications to these embodiments will be readily apparent to those skilled in the art. That is, the generic principles defined herein may be applied to other embodiments without departing from the spirit or scope of the embodiments of the disclosure.

The invention claimed is:

1. A method of operating at least one electrical controller configured to manage a battery bank arranged with a heterogeneous battery module configuration, comprising:
   monitoring a set of performance attributes associated with a plurality of battery modules of the battery bank, the plurality of battery modules being connected in series with each other;
   detecting, based on the monitoring, a first set of performance levels for the set of performance attributes in association with a first subset of the plurality of battery modules;

detecting, based on the monitoring, a second set of performance levels for the set of performance attributes in association with a second subset of the plurality of battery modules; and managing one or more bank-wide operational parameters based at least in part upon a differential between the first and second set of performance levels, wherein the one or more bank-wide operational parameters comprise a battery bank capacity, or wherein each of the plurality of battery modules comprises a plurality of parallel groups of battery cells (P-Groups), and the set of performance attributes comprises a minimum state of charge (SOC) or a minimum duty cycle across the plurality of P-Groups for a respective battery module.

2. The method of claim 1, wherein the set of performance attributes comprises module-specific capacity, module-specific voltage, module-specific discharge current limit, module-specific charging current limit, module-specific thermal limit, module-specific state of charge (SOC) or any combination thereof.

3. The method of claim 1, further comprising:
calculating a capacity of the battery bank based on the first and second set of performance levels;
sending the calculated battery bank capacity to a respective module-side controller at each of the plurality of battery modules;
receiving, in response to the sending from each respective module-side controller, a state of charge (SOC) of the associated battery module relative to the calculated battery bank capacity,
wherein the managing manages the one or more bank-wide operational parameters based at least in part upon the received SOCs.

4. The method of claim 1, wherein the one or more bank-wide operational parameters comprises the bank-wide capacity, bank-wide voltage, bank-wide discharge current limit, bank-wide charging current limit, bank-wide thermal limit, bank-wide minimum P-Group duty cycle, or any combination thereof.

5. The method of claim 1, wherein each of the plurality of battery modules comprises the plurality of P-Groups.

6. The method of claim 5, wherein the set of performance attributes comprises the minimum SOC across the plurality of P-Groups for the respective battery module.

7. The method of claim 6, wherein the managing includes:
determining a lowest of the minimum SOCs; and
sending the determined lowest of the minimum SOCs to a respective module-side controller at each of the plurality of battery modules to regulate P-Group duty cycles.

8. The method of claim 5, wherein the set of performance attributes comprises the minimum duty cycle across the plurality of P-Groups for the respective battery module.

9. The method of claim 8, wherein the managing includes:
determining a lowest of the minimum duty cycles; and
sending the determined lowest of the minimum duty cycles to a respective module-side controller at each of the plurality of battery modules to regulate P-Group duty cycles.

10. The method of claim 1, wherein the first set of performance attributes comprise one or more module-specific safety limits.

11. The method of claim 10,
wherein the one or more module-specific safety limits are adjusted to comply with one or more bank-wide safety limits, or wherein the one or more module-specific safety limits are independent of the one or more bank-wide safety limits.

12. The method of claim 10, wherein the one or more bank-wide operational parameters comprise one or more bank-wide safety limits.

13. The method of claim 12,
wherein the one or more bank-wide safety limits are calculated based on one or more module-specific safety limits adjusted to comply with one or more initial bank-wide safety limits, or
wherein the one or more bank-wide safety limits are calculated based on one or more module-specific safety limits that are independent of the one or more initial bank-wide safety limits.

14. A method of operating a module-side controller of a battery module of a battery bank arranged with a heterogeneous battery module configuration, comprising:
identifying a set of performance levels for a set of performance attributes of the battery module;
reporting, to at least one electrical controller, the set of performance levels;
receiving, from the at least one electrical controller in response to the reporting, one or more bank-wide operational parameters that are based on a differential between the set of performance levels of the battery module and one or more corresponding sets of performance levels for one or more other battery modules in the battery bank; and
implementing one or more module-specific control functions for the battery module based on the one or more bank-wide operational parameters,
wherein the one or more bank-wide operational parameters comprise a battery bank capacity, or
wherein the battery module comprises a plurality of parallel groups of battery cells (P-Groups), and the set of performance attributes comprises a minimum state of charge (SOC) or a minimum duty cycle across the plurality of P-Groups for the battery module.

15. The method of claim 14, wherein the set of performance attributes comprises module-specific capacity, module-specific voltage, module-specific discharge current limit, module-specific charging current limit, module-specific thermal limit, module-specific state of charge (SOC) or any combination thereof.

16. The method of claim 14, wherein the one or more bank-wide operational parameters comprise the battery bank capacity.

17. The method of claim 14, the battery module comprises the plurality of P-Groups.

18. The method of claim 17, wherein the set of performance attributes comprises the minimum SOC across the plurality of P-Groups for the battery module.

19. The method of claim 17, wherein the one or more bank-wide operational parameters comprise a lowest minimum SOC from amongst a plurality of battery modules in the battery bank.

20. The method of claim 17, wherein the set of performance attributes comprises the minimum duty cycle across the plurality of P-Groups for the battery module.

21. The method of claim 20, wherein the one or more bank-wide operational parameters comprise a lowest minimum duty cycle from amongst a plurality of battery modules in the battery bank.

22. The method of claim 14, wherein the first set of performance attributes comprise one or more module-specific safety limits.

23. The method of claim 22,
wherein the one or more module-specific safety limits are adjusted to comply with one or more bank-wide safety limits, or
wherein the one or more module-specific safety limits are independent of the one or more bank-wide safety limits.

24. The method of claim 22, wherein the one or more bank-wide operational parameters comprise one or more bank-wide safety limits.

25. The method of claim 24,
wherein the one or more bank-wide safety limits are calculated based on one or more module-specific safety limits adjusted to comply with one or more initial bank-wide safety limits, or
wherein the one or more bank-wide safety limits are calculated based on one or more module-specific safety limits that are independent of the one or more initial bank-wide safety limits.

26. At least one electrical controller configured to manage a battery bank arranged with a heterogeneous battery module configuration, comprising:
a memory;
a communications interface; and
at least one processor communicatively coupled to the memory and the communications interface and configured to:
monitor a set of performance attributes associated with a plurality of battery modules of the battery bank, the plurality of battery modules being connected in series with each other;
detect, based on the monitoring, a first set of performance levels for the set of performance attributes in association with a first subset of the plurality of battery modules;
detect, based on the monitoring, a second set of performance levels for the set of performance attributes in association with a second subset of the plurality of battery modules; and
manage one or more bank-wide operational parameters based at least in part upon a differential between the first and second set of performance levels,
wherein the one or more bank-wide operational parameters comprise a battery bank capacity, or
wherein each of the plurality of battery modules comprises a plurality of parallel groups of battery cells (P-Groups), and the set of performance attributes comprises a minimum state of charge (SOC) or a minimum duty cycle across the plurality of P-Groups for a respective battery module.

27. A module-side controller of a battery module of a battery bank arranged with a heterogeneous battery module configuration, comprising:
a memory;
a communications interface; and
at least one processor communicatively coupled to the memory and the communications interface and configured to:
identify a set of performance levels for a set of performance attributes of the battery module;
report, to at least one electrical controller, the set of performance levels;
receive, from the at least one electrical controller in response to the reporting, one or more bank-wide operational parameters that are based on a differential between the set of performance levels of the battery module and one or more corresponding sets of performance levels for one or more other battery modules in the battery bank; and
implement one or more module-specific control functions for the battery module based on the one or more bank-wide operational parameters,
wherein the one or more bank-wide operational parameters comprise a battery bank capacity, or
wherein the battery module comprises a plurality of parallel groups of battery cells (P-Groups), and the set of performance attributes comprises a minimum state of charge (SOC) or a minimum duty cycle across the plurality of P-Groups for the battery module.

* * * * *